(12) United States Patent
Daniell

(10) Patent No.: US 6,490,094 B2
(45) Date of Patent: Dec. 3, 2002

(54) HIGH ACUITY LENS SYSTEM

(75) Inventor: Stephen Daniell, Easthampton, MA (US)

(73) Assignee: Zograph, LLC, Northampton, MA (US)

(*) Notice: Subject to any disclaimer, the term of this patent is extended or adjusted under 35 U.S.C. 154(b) by 0 days.

(21) Appl. No.: 09/811,212

(22) Filed: Mar. 16, 2001

(65) Prior Publication Data

US 2002/0008917 A1 Jan. 24, 2002

Related U.S. Application Data

(60) Provisional application No. 60/190,449, filed on Mar. 17, 2000, and provisional application No. 60/255,337, filed on Dec. 13, 2000.

(51) Int. Cl.$^7$ .............................................. G02B 27/10
(52) U.S. Cl. ...................................... 359/622; 359/626
(58) Field of Search ................................ 359/619, 621, 359/622, 623, 624, 626

(56) References Cited

U.S. PATENT DOCUMENTS

| | | | |
|---|---|---|---|
| 2,313,947 A | 3/1943 | Klinkum | 88/28.93 |
| 3,255,665 A | 6/1966 | Weiher et al. | 88/60 |
| 3,503,315 A | 3/1970 | de Montebello | 95/18 |
| 3,530,779 A | 9/1970 | Alofs | 95/18 |
| 3,544,190 A | 12/1970 | Moorhusen et al. | 350/6 |
| 3,675,553 A | 7/1972 | Dudley | 95/18 P |
| 3,683,773 A | 8/1972 | Dudley | 95/18 |
| 3,706,486 A | 12/1972 | de Montebello | 350/167 |
| 3,853,395 A | 12/1974 | Yevick | 353/27 |
| 3,978,500 A | 8/1976 | Brachet | 354/123 |
| 4,094,585 A | 6/1978 | Betensky | 350/175 E |
| 4,114,983 A | 9/1978 | Maffitt et al. | 350/164 |
| 4,128,324 A | 12/1978 | Seeger | 354/112 |
| 4,140,370 A | 2/1979 | Snaper et al. | 350/128 |
| 4,162,827 A * | 7/1979 | Ito | 351/207 |

(List continued on next page.)

FOREIGN PATENT DOCUMENTS

| | | |
|---|---|---|
| JP | 2000113489 | 4/2000 |
| WO | 94/11781 | 5/1994 |
| WO | 99/38046 | 7/1999 |

OTHER PUBLICATIONS

Halle, Michael, *Autostereoscopic Displays and Computer Graphics*, Surgical Planning Laboratory, Department of Radiology, Brigham and Women's Hospital, 1997.

Halle, Michael, *Multiple Viewpoint Rendering*, Brigham And Women's Hospital, 1998.

Levoy, M. and Hanrahan, P., *Light Field Rendering*, Stanford University, Proc. ACM SIGGRAPH 1996.

Isaksen, A., McMillan, L., and Gortler, S., *Dynamically Reparameterized Light Fields*, MIT/Harvard University, ACM SIGGRAPH Jan. 2001.

Nakajima, S., Nakamura K., Masamune K., Sakuma I., and Dohi T., *Three–dimensional medical imaging display with computer–generated integral photography*, Computerized Medical Imaging Graphics, 2001; 25(3):235–41.

Naemura, T., Yoshida, T., and Harashima, H., 3–D computer graphics based on integral photography, journal of the Optical Society of America, vol. 8 No. 2, Feb. 2001.

*Primary Examiner*—Ricky Mack
(74) *Attorney, Agent, or Firm*—Testa, Hurwitz & Thibeault, LLP

(57) ABSTRACT

A lens system which has a first optical boundary with a radius of curvature R, a second optical boundary located substantially a distance R from the first boundary, and a third optical boundary nearer to the second optical boundary than R. Secondly, a lens system providing optical field limitation using total internal reflection. Also, an array of lenses for reproduction, capture and display of three dimensional images discussed.

27 Claims, 27 Drawing Sheets

U.S. PATENT DOCUMENTS

| | | | |
|---|---|---|---|
| RE30,804 E | 11/1981 | Lindemann et al. | 350/410 |
| 4,425,501 A | 1/1984 | Stauffer | 250/216 |
| 4,632,522 A | 12/1986 | Ishitani | 350/570 |
| 4,668,063 A | 5/1987 | Street | 354/112 |
| 4,708,920 A | 11/1987 | Orensteen et al. | 430/11 |
| 4,732,453 A | 3/1988 | de Montebello et al. | 350/130 |
| 4,747,667 A | 5/1988 | Tanaka et al. | 350/167 |
| 4,815,098 A * | 3/1989 | Manabe | 359/797 |
| 4,882,262 A | 11/1989 | Wilwerding | 430/321 |
| 5,083,199 A | 1/1992 | Börner | 358/88 |
| 5,166,830 A | 11/1992 | Ishibai et al. | 359/71 |
| 5,278,608 A | 1/1994 | Taylor et al. | 355/22 |
| 5,279,912 A | 1/1994 | Telfer et al. | 430/17 |
| 5,281,301 A | 1/1994 | Basavanhally | 156/629 |
| 5,300,263 A | 4/1994 | Hoopman et al. | 264/2.5 |
| 5,310,623 A | 5/1994 | Gal | 430/321 |
| 5,349,471 A | 9/1994 | Morris et al. | 359/565 |
| 5,373,335 A | 12/1994 | Street | 354/112 |
| 5,475,536 A | 12/1995 | Kikutani | 359/794 |
| 5,536,455 A | 7/1996 | Aoyama et al. | 264/1.7 |
| 5,543,966 A | 8/1996 | Meyers | 359/565 |
| 5,579,164 A | 11/1996 | Chapnik | 359/618 |
| 5,680,252 A | 10/1997 | Sitter, Jr. et al. | 359/566 |
| 5,717,453 A | 2/1998 | Wohlstadter | 348/46 |
| 5,757,545 A | 5/1998 | Wu et al. | 359/463 |
| 5,933,276 A | 8/1999 | Magee | 359/455 |
| 5,969,863 A | 10/1999 | Staub et al. | 359/567 |
| 5,978,159 A | 11/1999 | Kamo | 359/793 |
| 5,995,304 A | 11/1999 | Nomura et al. | 359/726 |
| 6,104,536 A * | 8/2000 | Eckhardt | 359/619 |
| 6,118,597 A | 9/2000 | Maruyama | 359/743 |
| 6,271,975 B1 * | 8/2001 | Grupp | 359/721 |
| 6,288,842 B1 | 9/2001 | Florczak et al. | 359/619 |

* cited by examiner

TRANSMITTANCE VS. Θ

RELATIVE IRRADIANCE OF FIELD

FIELD OVERLAP PLOT

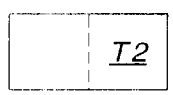 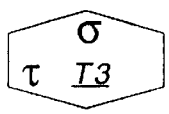 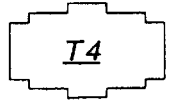 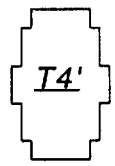
fig. 29A  fig. 29B  fig. 29C  fig. 29D
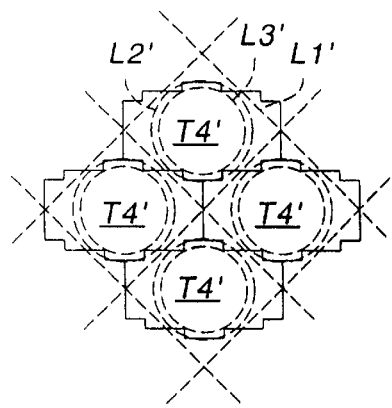 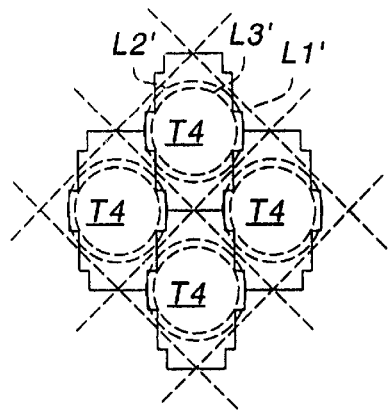 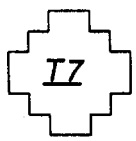
fig. 30A  fig. 30B  fig. 31
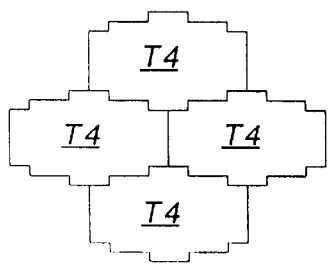 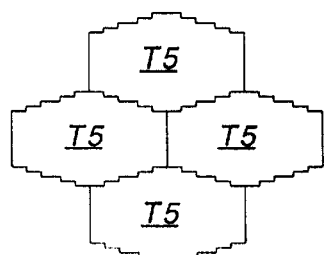 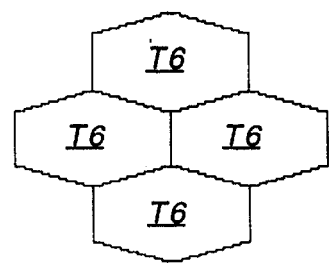
fig. 32A  fig. 32B  fig. 32C

HIGH ACUITY LENS SYSTEM

RELATED APPLICATIONS

This application claims priority under 35 U.S.C. §119(e) to U.S. provisional patent application Serial No. 60/190,449, filed Mar. 17, 2000, and U.S. provisional patent application Serial No. 60/255,337, filed Dec. 13, 2000, which are incorporated herein by reference in its entirety.

BACKGROUND OF THE INVENTION

DESCRIPTION OF THE RELATED ART

Stereoscopic systems provide a viewer with a three-dimensional representation of a scene (or an object), using two or more, two-dimensional representations of the scene. The two-dimensional representations of the scene are taken from slightly different angles.

The goal of stereoscopic systems is to produce one or more binocular views of a scene to the viewer. A full-parallax view accurately simulates depth perception irrespective of the viewer's motion, as it would exist when the viewer observes a real scene.

Stereoscopic systems include autostereoscopic systems and non-autostereoscopic systems. Non-autostereoscopic systems require a viewer to use a device, such as viewing glasses, to observe the three-dimensional view, while the three-dimensional effect of autostereoscopic systems may be observed by viewing the system directly.

Early stereoscopic devices used prismatic, total internal reflection (TIR) to simultaneously present two views of a scene, such as the Swan Cube. Prismatic TIR allowed the views to be presented to the viewer such that each of the viewer's eyes was presented one of the two images, thus creating a perception of depth. Prismatic devices simulate depth perception for only a single viewing angle.

After the introduction of transparent plastic optics, autostereoscopic devices using one-dimensional arrays of cylindrical lenses (known as lenticular lenses) were created. A lenticular lens array has an associated array of composite strip images. Each lenticular lens presents the viewer a selected portion of its strip image such that the combined presentation of all of the lenticular lenses presents a three-dimensional view of the scene.

Devices using lenticular lenses have several shortcomings. First, because the lenticular lenses are cylindrical (i.e., they have optical power in a single dimension), they produce parallax only on a horizontal viewing axis. If the viewer's viewing angle departs from the horizontal viewing axis, the three-dimensional representation ceases to exist. Second, the lenticular lenses are highly astigmatic, and therefore, the viewer cannot bring the three-dimensional representation fully into focus. Third, if the two-dimensional images require illumination through the lenticular arrays (i.e., the images are not self-radiant, or the images are not printed on a transparent or translucent material that is capable of backlighting), the three-dimensional presentation will have uneven radiance resulting from uneven distribution within the array.

Another autostereoscopic system uses an array of spherical (or aspherical) lenses. Spherical lens array systems have an associated two-dimensional array of microimages. Each microimage is a two-dimensional view of a scene, captured from a slightly different angle. Unlike lenticular lenses, spherical lenses have optical power in two dimensions, thus allowing the viewer to maintain a three-dimensional representation of a scene despite departing from the horizontal viewing axis.

Each spherical lens presents the viewer a selected portion of a corresponding microimage such that the combined presentation of all of the spherical lenses presents a three-dimensional view of a scene. Ideally, each lens system of the lens array corresponds to a single microimage, such that when a viewer views the microimages through the lens array, each lens system transmits a single color or tone, from a selected portion of a single, corresponding microimage.

The shortcomings of spherical arrays have included that lenses in a lens arrays have excessive aberrations and a tendency to transmit light from multiple microimages. Both of these shortcomings have resulted in reduced image quality.

An additional advantage of spherical (or aspherical) arrays of lenses is there ability to capture arrays of microimages for use with three-dimensional viewing systems. The process of capturing arrays of microimages is known as integral imaging. An image captured by a spherical lens array is initially pseudoscopic, but may be made orthoscopic by reproduction of a captured image using a second array.

A difficulty encountered in capturing and reproducing images is optical crosstalk between lens systems of the array. Crosstalk causes overlap of adjacent images, resulting in degradation of the microimages. Solutions to crosstalk have ranged from modifications of the scene when creating the microimages, to optomechanical modifications of the lens arrays. Optomechanical modifications of the lens arrays have included baffles that limit the field of the lens systems comprising a lens array. The baffled lens systems are said to be field-limited. And a field-limited system whose field does not overlap the field of adjacent lens systems is said to be "isolated." Solutions to crosstalk have been costly to implement.

SUMMARY OF THE INVENTION

An aspect of lens systems of the present invention is a high acuity lens system comprising three optical boundaries having optical power. The lens system comprises a first boundary having a radius of curvature R, a second boundary located substantially a distance R from the first surface, and a third surface located at least 0.05 R from the second boundary.

Another aspect of lens systems of the present invention is a lens array having a lens system that is "optically field-limited." An optically field-limited system is a system wherein the edges of the field of the system are determined by the optical properties of lens material of the system. Accordingly, in the present invention, light within the field of a lens is substantially transmitted by the lens, and light at greater field angles than the edges of the field is substantially reflected by a surface of the lens system, using total internal reflection.

BRIEF DESCRIPTION OF THE DRAWINGS

Preferred, non-limiting embodiments of the present invention will be described by way of example with reference to the accompanying drawings, in which:

FIG. 29A is a plan view rectangular microimage;

FIG. 29B is a plan view of a hexagonal microimage;

FIG. 29C is a plan view of a first orientation of a stepped rectangular microimage;

FIG. 29D is a plan view of a second orientation of a stepped rectangular microimage;

FIG. 30A is schematic top view of a first orientation of a stepped rectangular microimage and canted square lens array;

FIG. 30B is schematic top view of a second orientation of a stepped rectangular microimage and canted square lens array;

FIG. 31 is a plan view of a stepped cruciform microimage

FIG. 32A is a plan view of a coarsely stepped rectangular tiling of microimages;

FIG. 32B is a plan view of a moderately stepped rectangular tiling of microimages;

FIG. 32C is a plan view of a finely stepped rectangular tiling of microimages.

SUMMARY OF THE INVENTION

A lens system, having a conjugate point comprising a first convex surface having a radius of curvature R, a first concave surface optically coupled to the first convex surface via a first material, the first concave surface positioned a distance substantially equal to R from the first convex surface, and a second convex surface optically coupled to the first concave surface via a material having a lower index of refraction than the first material, the second convex surface positioned at least a distance equal to 0.05 R from the first concave surface.

A lens array, comprising a plurality of lens systems, the lens systems comprising a first convex surface having a radius of curvature R and a first concave surface optically coupled to the first convex surface via a first material, the first concave surface positioned a distance substantially equal to R from the first convex surface. The lens systems further comprising a second convex surface optically coupled to the first concave surface via a material having a lower index of refraction than the first material, the second convex surface positioned at least a distance equal to 0.05 R from the first concave surface.

DETAILED DESCRIPTION OF THE INVENTION

Throughout the description below, features having common numbers have common function.

Figure 1A:
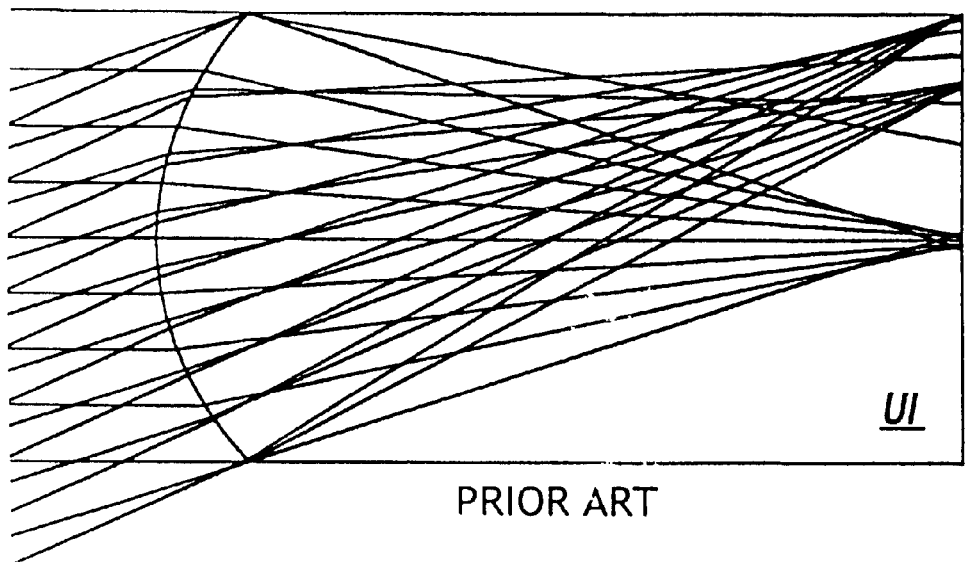
FIG. 1A illustrates aberration in uncorrected arrays.
Figure 1B:
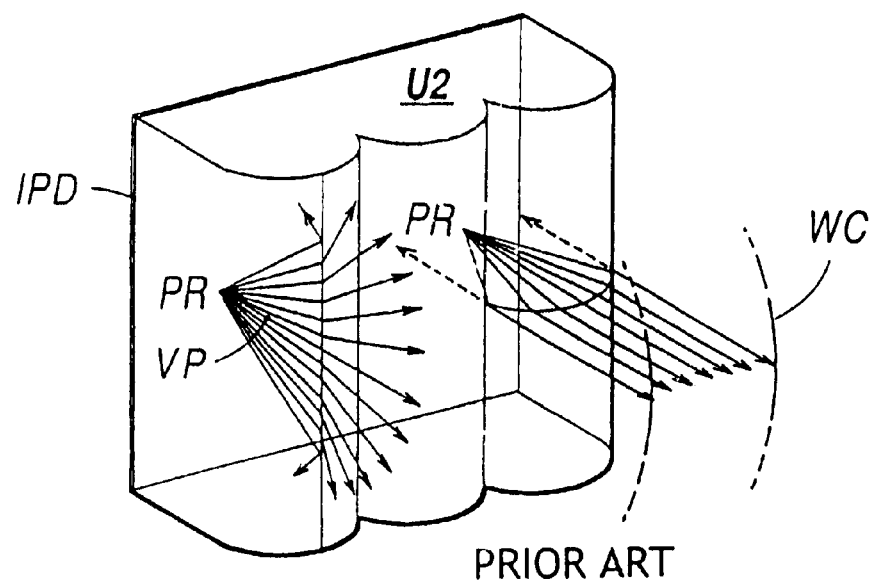
FIG. 1B illustrates aberration in a lenticular array.

The invention includes features that can reduce aberrations in lens arrays. FIGS. 1A and 1B are cross sectional side views of a lens element that illustrate aberration in uncorrected lens systems. In uncorrected element U1 in FIG. 1, the defect of focus is predominantly due to spherical aberration. Marginal rays converge at a shorter focus than rays entering near the axis of the lens. In uncorrected element U2 in FIG. 1B, it may be seen that, in cylindrical lens elements, the defect of focus is further compounded by astigmatism. A graphic element on display image plane IPD of U2 may be imagined as radiating point PR emitting in all directions. A ray trace on the longitudinal axis of a cylindrical lens, as shown at the left of FIG. 1B produces a different geometry from that on the transverse axis, shown on the right. The combined geometries produce astigmatic cylindrical wavefront CW. Systems within the invention propose the use of rotationally-symmetrical microlens arrays, which are inherently free of astigmatism, and which include aspheric surfaces that can significantly reduce the remaining defects of focus.

A lens system according to the present invention can be designed to operate as a focal or an afocal system depending on the application of the system. Afocal systems include both infinite and virtual object planes. FIG. 2A–FIG. 2D are schematic drawings of various focal situations appropriate for use with the present invention.

Figure 2A:
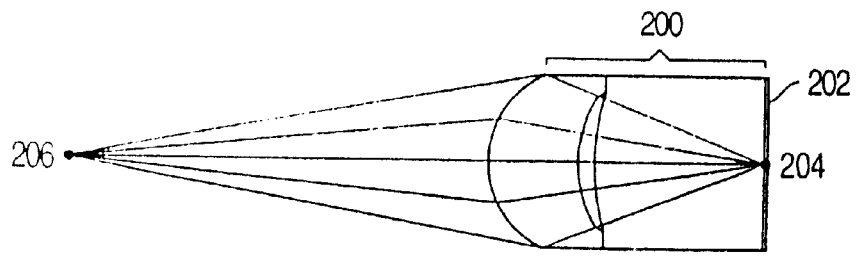
FIG. 2A–FIG. 2D are schematic diagrams of embodiments of a lens systems illustrating a focal situations appropriate for use with the present invention.

FIG. 2A is a cross sectional view of a lens system 200 according to the present invention. Lens system 200 has an image plane 202. Image point 204 is located on image plane 202. Lens system 200 is a focal system and converges light from image point 204 to a finite object point 206. Field limited lens systems having a finite object point 206 are useful in devices such as telecommunication devices, or reproduction systems as described below.

Figure 2B:
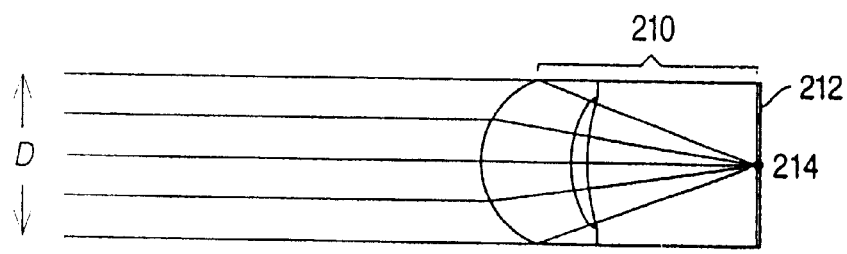

FIG. 2B is a cross sectional view of a lens system 210 according to the present system. Lens system 210 has an image plane 212. Image point 214 is located on image plane 212. Lens system 210 is an afocal system and focuses light from image point 214 to an infinite object plane. A lens system having an infinite object plane can be useful in devices to be viewed by a human being, or in optical communications. However, when viewing an array of collimating lens systems having an outer surface dimension smaller than the viewer's pupil diameter D, the viewer's pupil may be underfilled allowing surrounding sources of light such as adjacent collimated lens systems to degrade the viewer's ability to focus the output of lens 210. Diameter D is referred to as the pupillary diameter.

Figure 2C:
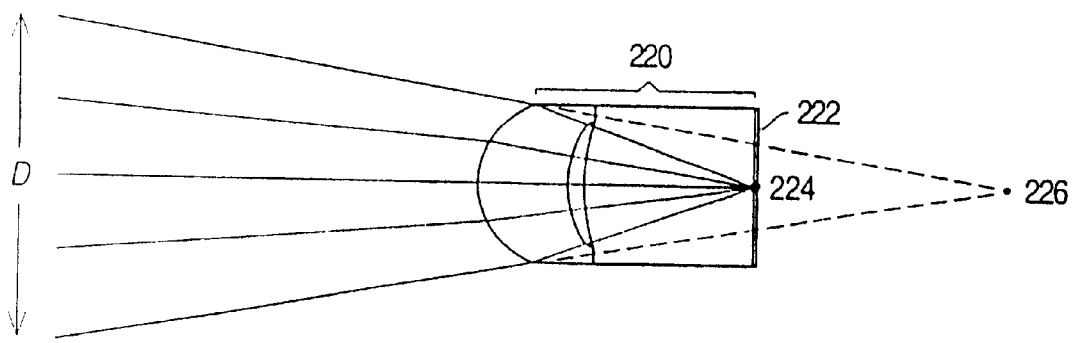
Figure 2D:
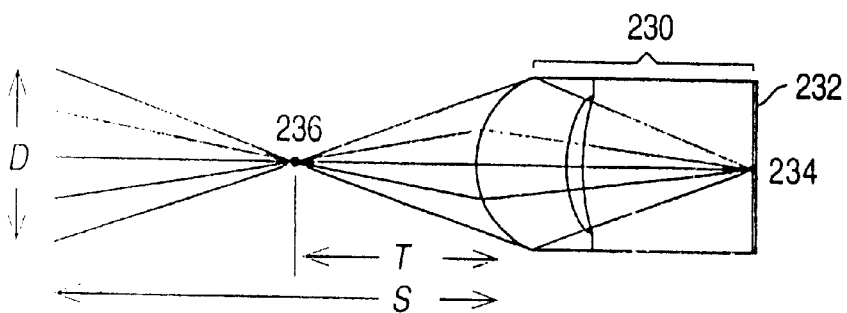

FIG. 2D is a cross sectional view of a lens system 220 according to the present invention. Lens system 220 has an image plane 222. Image point 224 is located on image plane 222. Lens system 220 is an afocal system, which diverges light from image point 224 to form a virtual image point 226. A viewer receiving light from lens system 220 would observe a point appearing to originate behind lens system 220.

Lens systems having a virtual object point are useful in devices designed for viewing by a human being. In particular, in lens systems having an outer surface dimension smaller than the pupillary diameter D, the lens system can be designed to fill a viewer's pupil. In a system to be viewed by a human being, pupillary diameter D is preferably approximately equal to the diameter of the pupil of the human eye, at an anticipated viewing distance S.

FIG. 2D is a cross sectional view of a lens system 230 according to the present invention. Lens system 230 has an image plane 232. Image point 234 is located on image plane 232. Lens system 230 is a focal system and converges light from image point 234 to form a finite object point 236. A viewer receiving light from lens system 230 would observe a point appearing to originate in front of lens system 220.

Object point 236 is located a distance T from lens system 230. Lens system 230 is designed to be viewed by an viewer at a distance S from lens system 230, where S is greater than T, such that the light would fill the viewer's pupil at distance S. A viewer observing lens system 230 would receive a image appearing to originate in front of lens system 230.

Features described with reference to FIG. 2c-FIG 2d will be applied to array systems of the present invention to improve the quality of systems to be viewed by a human being.

Throughout the specification the following definitions will apply. The phrases "object plane" and "image plane" refer to conjugate planes of a lens system or an array of lens systems. However, the terms "object" and "image" are non-limiting, and image planes and object planes can be photo-emitting, photo-detective, both, or neither, depending on the specific application of a lens system. The phrase "object point" refers to points on either a finite or infinite object plane of a lens system. The phrase "image point" refers to a point on an image plane of a lens system.

Figure 3A:
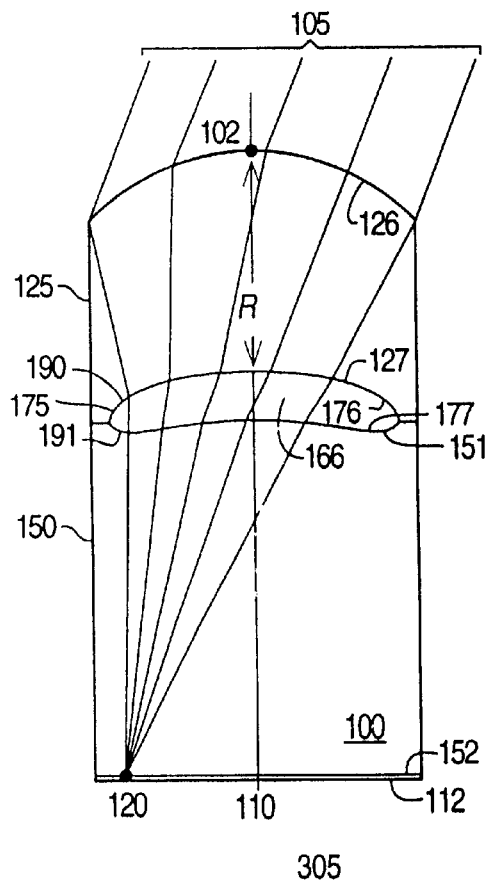
FIG. 3A is a cross sectional side view of one example of an embodiment of a three-element lens system according to the present invention.

FIG. 3A is a cross sectional side view of one example of an embodiment of a high acuity three-element lens system 100 according to the present invention. Lens system 100 has an optical axis 110, and an image plane 112. Rays of light 105 correspond to an object point and an image point 120. Lens 100 includes a first lens 125, a second lens 150, and a region 166 between lens 125 and lens 150.

Lens system 100 is any multielement optical system, which includes a first lens 125, a second lens 150, and a region 166 between lens 125 and lens 150, wherein region 166 is a low index material, other than air. Lens system 100 is any optical system, which includes a first lens 125, a second lens 150, and a region 166 between lens 125 and lens 150, wherein region 166 is a material, other than air, wherein region 166 forms a third lens 175 between first lens 125 and second lens 150. Lens system 100 is any optical system, which includes a first lens 125, a second lens 150, and a region 166 between lens 125 and lens 150, wherein region 166 is a material, other than air, wherein region 166 forms a third lens 175 between first lens 125 and second lens 150, and wherein a first surface 176 and a second surface 177 of the third lens 175 are defined by the first lens 125 and second lens 150.

First lens 125 has a first surface 126, a second surface 127, and is constructed of a material having a relatively high index of refraction. Second lens 150 has a first surface 151, a second surface 152 and is constructed of any material having a relatively high index of refraction.

First lens 125 and second lens 150 can be constructed of any material having a relatively high index of refraction that is optically transparent. First lens 125 and second lens 150 can be constructed of any material having a relatively high index of refraction that is optically transparent at optical or infrared wavelengths. First lens 125 and second lens 150 can be constructed of any material having a relatively high index of refraction that is optically transparent at optical or infrared wavelengths, and is configurable into an optical lens element. First lens 125 and second lens 150 can be constructed of any material having a relatively high index of refraction that is optically transparent at optical or infrared wavelengths, and is configurable into an optical lens element, wherein the index of refraction is approximately equal to 1.6. Polycarbonate, styrene, polyamides, polysulfones, optical glasses, or infrared-transmitting materials such as germanium are examples of materials appropriate for constructing lenses 125 and 150. It is understood that other materials having a relatively high index of refraction can be used.

Third lens 175 occupying region 166 can be constructed of any material having an index of refraction lower than first lens 125 and second lens 150. Third lens 175 can be formed of any material having an index of refraction lower than first lens 125 and second lens 150, wherein the index of refraction is between 1.29 and 1.42. Examples of materials appropriate for constructing third lens 175 are low-index fluouropolymers, optical fluids, gels, ceramics, optical foams, slurries, and compounds. One specific example of an optical foam is Sol-Gel. It is understood that other materials having a relatively low index of refraction can be used.

Three-element lens system 100 has three optical boundaries that have non-zero optical power, first surface 126, second boundary 190, and third boundary 191. First surface 126 has a first vertex 102 and a radius of curvature R. First surface 126 is any optical boundary having positive power. First surface 126 is any optical boundary having positive power and a convex surface.

Second boundary 190 is at the interface of second surface 127 of first lens 125 and the first surface 176 of the third optical lens 175. Second boundary 190 is any optical boundary having a negative power. Second boundary 190 is any optical boundary having a negative power such that second surface 127 of first lens 125 has a concave curvature. Second boundary 190 is any optical boundary having a negative power such that second surface 127 of first lens 125 has an oblate, concave curvature. Second boundary 190 is any optical boundary having a negative power such that second surface 127 of first lens 125 has an oblate, concave curvature, wherein second boundary 190 is located substantially a distance R from first surface 126. Second boundary 190 can be located between 0.7 R and 1.4 R away from first vertex 102.

Third boundary 191 is the interface of first surface 151 of second lens 150, and the second surface 177 of the third lens 175. Third boundary 191 is any optical boundary having a positive power. Third boundary 191 is any optical boundary having a positive power such that first surface 151 of second lens 150 is convex. Third boundary 191 is any optical boundary having a positive power such that first surface 151 of second lens 150 is a prolate or reflexed, convex surface. For purposes of this disclosure the term "reflexed" shall mean a boundary having regions of locally convex curvature and regions of locally concave curvature. Second boundary 191 is located at least 0.05 R from first boundary 190 at optical axis 110.

Fourth surface 152 is an optical boundary. Fourth surface 152 is any optical boundary having a continuous surface. Optical surface 152 is any optical boundary having a continuous surface and zero optical power. Preferably, fourth surface 152 is a continuous surface, having zero optical power disposed at the image plane 112 of lens system 100.

Optionally, lens system 100 may include one or more surfaces having coatings for antireflection, antiabrasion or heat resistance purposes. As an alternative or a compliment to antireflection coatings, a sub-wavelength microstructure may be used to reduce reflections. Sub-wavelength micro structures may be produced during the molding process if lenses are produced using a molding process. Additionally, any lens surface may be a hybrid refractive/diffractive surface, for reasons such as to reduce chromatic aberrations.

Figure 3B:
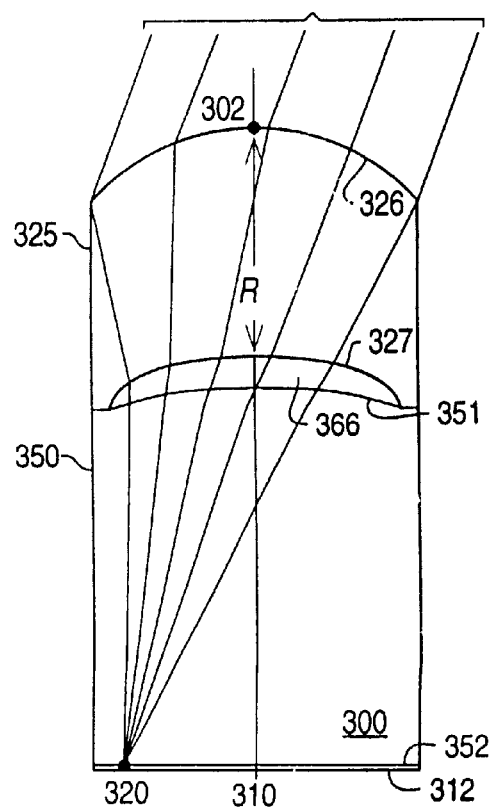
FIG. 3B is a cross sectional side view of one example of an embodiment of a two-element lens system according to the present invention.

FIG. 3B is a cross sectional side view of one example of an embodiment of a two-element lens system 300 according to the present invention. In a two-element system, such as lens system 300, the low index material of region 366 between lens 325 and lens 350 is void. One of ordinary skill in the art would understand that the term "void" to include vacuum, or a gas, such as air, wherein region 366 is an "air gap."

Lens system 300 is any multielement optical system, which includes a first lens 325, a second lens 350, and a region 366 between lens 325 and lens 350. Lens system 300 has an optical axis 310, and an image plane 312. Rays of light 305 originate from an object point.

First lens 325 has a first surface 326, a second surface 327. Second lens 350 has a first surface 351, a second surface 352

First lens 325 and second lens 350 can be constructed of any material that is optically transparent. First lens 325 and second lens 350 can be constructed of any material that is optically transparent at optical or infrared wavelengths. First lens 325 and second lens 350 can be constructed of any material that is optically transparent at optical or infrared wavelengths, and is configurable into an optical lens element. First lens 325 and second lens 350 can be constructed of any material that is optically transparent at optical or infrared wavelengths, and is configurable into an optical lens element, wherein the index of refraction is approximately equal to 1.5–1.8. Polycarbonate, acrylic, styrene, polyamides, polysulfones, optical glasses, or infrared-transmitting materials such as germanium are examples of materials appropriate for constructing lenses 325 and 350. It is understood that other materials having a similar index of refraction can be used.

Lens system 300 has three optical boundaries that have non-zero optical power, first surface 326, second surface 327, and third surface 351. First surface 326 is any optical boundary having positive power. First surface 326 is any optical boundary having positive power and a convex surface. First surface 326 has a first vertex 302 and radius of curvature R.

Second surface 327 is an optical boundary having a negative power. Second surface 327 is any concave optical boundary having negative power. Second boundary 391 is any oblate, concave optical boundary having negative power. Second surface 327 is any concave, oblate optical boundary having negative power, located substantially a distance R from first surface 323. Second surface 327 can be located between 0.7 R and 1.4 R away from first vertex 302.

Third surface 351 is an optical boundary having positive power. Third surface 351 is any convex optical boundary having positive power. Third surface 351 is any convex, spherical optical boundary having positive power. Third surface 351 is any convex, spherical optical boundary having positive power. Alternatively third surface 351 can be oblate, or prolate, or a higher order asphere. Third surface 351 is located at least 0.05 R from second surface 327 at optical axis 310.

Fourth surface 352 is an optical boundary. Fourth surface 352 is any optical boundary having a continuous surface. Optical surface 352 is any optical boundary having a continuous surface and zero optical power. Preferably, fourth surface 352 is a continuous surface, having zero optical power disposed at the image plane 312 of lens system 300.

Optionally, lens system 300 may include one or more surfaces having coatings for antireflection, antiabrasion or heat resistance purposes. As an alternative or a compliment to an antireflection coatings a sub-wavelength microstructure may be used to reduce reflections. Sub-wavelength microstructures may be produced during the molding process if lenses are produced using molding a molding process. Additionally, any lens surface may be a hybrid refractive/diffractive surface, for reasons such as to reduce chromatic aberrations.

As stated above, throughout the specification the following definitions will apply. The phrases "object plane" and "image plane" refer to conjugate planes of a lens system or an array of lens systems. However, the terms "object" and "image" are non-limiting, and image planes and object planes can be photo-emitting, photo-detective, both, or neither, depending on the specific application of a lens system.

The phrase "object point" refers to points on either a finite or infinite object plane of a lens system. The phrase "object-side field angle" refers to the angle, as measured on the object side of a lens system, formed between the optical axis of a lens system and the ray of light from an object point that is transmitted through the center of the aperture stop of the lens system. The phrase "edge of the object-side field" refers to the field angle at the furthest angular distance from optical axis for which the lens system transmission is reduced to substantially zero. In one embodiment, at the edge of the object-side field, the lens system transmits no more than 1% of the light incident on a lens system to the image plane. It is understood that the lens system discussed below have a single edge of the object-side field that is rotationally symmetric about the optical axis. Accordingly, in a cross sectional view, which includes the optical axis, the lens systems will have two edges of the object-side field, each edge a part of the single edge of the object-side field. The phrase "object-side field" refers to all points within the edges of the object-side field. Object points having an object-side field angle greater than the edge of the object-side field are said to be "beyond the edge of the field."

The phrase "image point" refers to points on either a finite or infinite image plane of a lens system. The phrase "image-side field angle" refers to the angle, as measured on the image side of a lens system, formed between the optical axis of a lens system and the ray of light from an image point that is transmitted through the center of the aperture stop of the lens system. The phrase "edge of the image-side field" refers to the field angle at the furthest angular distance from optical axis for which the lens system transmission is reduced to substantially zero. In one embodiment, at the edge of the image-side field, the lens system transmits no more than 1% of the light incident on a lens system to the object plane. It is understood that the lens system discussed below have a single edge of the image-side field that is rotationally symmetric about the optical axis. Accordingly, in a cross sectional view, which includes the optical axis, the lens systems will have two edges of the image-side field, each edge a part of the single edge of the image-side field. The phrase "image-side field" refers to all points within the edges of the image-side field. Object points having an image-side field angle greater than the edge of the image-side field are said to be "beyond the edge of the field."

Figure 4A:
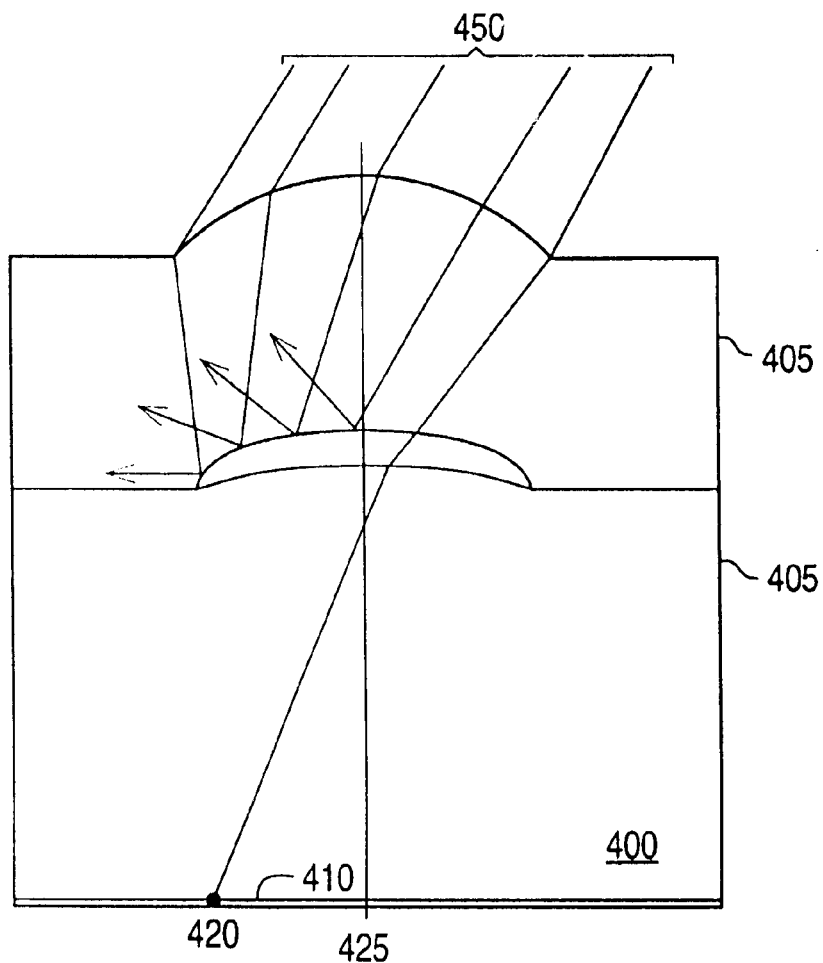
FIG. 4A is a cross sectional side view of one example of a discrete lens system that is object-side optically field-limited.

FIG. 4A is a cross sectional side view of one example of an embodiment of a discrete lens system 400 that is object-side optically field limited. Lens system 400 is a generic multielement lens system having one or more lens elements 405, and having an effective focal length F (not shown). Lens system 400 has an image plane 410, and an optical axis 425.

Light rays 450 form an image point 420 on image plane 410. Light rays 450 originate from an object point at the edge of the object-side field.

An object-side optically field-limited system is any system where the object-side edges of the field of the system are determined by the optical properties of lens material of the system. An object-side optically field limited lens system is any lens system for which the object-side edge of the field is substantially determined by total internal reflection. An object-side field limited lens system is any lens system for which the object-side edge of the field is substantially determined by total internal reflection, and the transmission of light from object points in proximity to the object-side edge of the field as a function of field angle is substantially in the shape of the transmission curve of internal reflection as a function of angle of incidence. Cases 5–9 above, are examples of lens systems having an lens systems that are object-side field-limited.

Figure 4B:
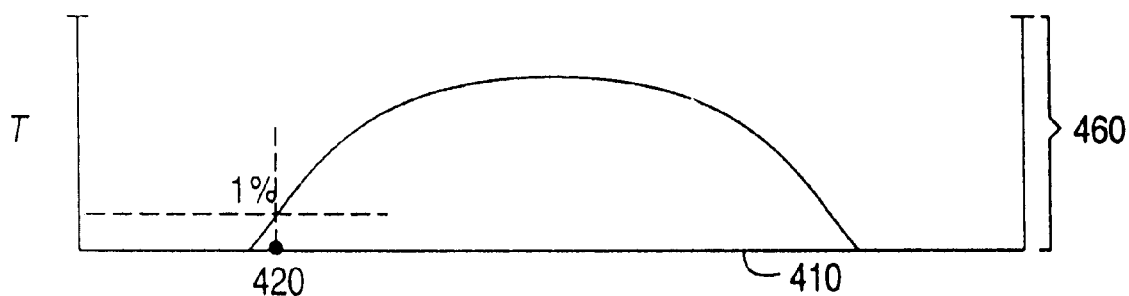
FIG. 4B is transmission curve of an object-side optically field limited lens system, as a function of location in an image plane.

FIG. 4B is a transmission curve 460 illustrating transmission T of an object-side, optically field limited lens system 400, as a function of location in image plane 410. Because point 420 corresponds to the edge of the object field, the transmission of light to point 420 is no more than 1%.

Figure 5A:
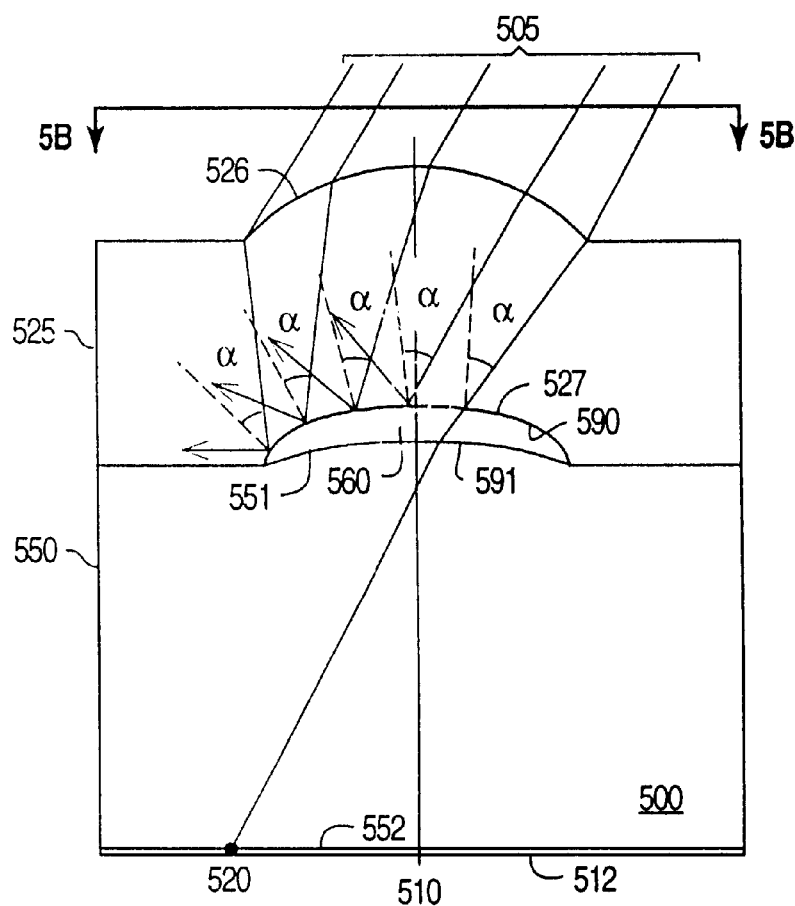
FIG. 5A is a cross sectional side view of one example of an embodiment of a lens system that is object-side optically field-limited.

FIG. 5A is a cross sectional side view of one example of an embodiment of a lens system 500 that is object-side optically field limited. Lens system 500 is any multielement optical system, which includes a first lens 525, a second lens 550, and a region 560 between lens 525 and lens 550. Lens system 500 has a focal length F, an optical axis 510, and an image plane 512. Light rays 505 originate from an object point at the edge of the object-side field. Light rays 505 form an image point 520.

First lens 525 has a first surface 526, a second surface 527. Second lens 550 has a first surface 551, a second surface 552. First lens 525 and second lens 550 can be constructed of any material that is optically transparent. First lens 525 and second lens 550 can constructed of any material that is optically transparent at optical or infrared wavelengths. First lens 525 and second lens 550 can be constructed of any material that is optically transparent at optical or infrared wavelengths, and is configurable into an optical lens element. Polycarbonate, styrene, polyamides, polysulfones, optical glasses, or infrared-transmitting materials such as germanium, are examples of materials appropriate for constructing lenses 525 and 550. It is understood that other materials having a relatively high index of refraction can be used.

Region 560 can be constructed of any material having a lower index than the material of lens 525 and lens 550. Region 560 can be void or constructed of any material having a lower index than the material of lens 525 and lens 550 that is optically transparent to optical or infrared wavelengths of light. Region 560 can be void or constructed of any material having a lower index than the material of lens 525 and lens 550 that is optically transparent to optical or infrared wavelengths of light and is configurable into an optical lens element.

Lens system 500 has three optical boundaries that have non-zero optical power, first surface 526, second boundary 590 at second surface 527, and third boundary 591 at third surface 551. First surface 526 is an optical boundary having a positive power. First surface 526 is any optical boundary having a positive power and convex curvature. Second boundary 590 is an optical boundary having a negative power. Second boundary 590 is any optical boundary having a negative power, wherein second surface 527 has a concave curvature. Second boundary 590 is any optical boundary having a negative power, wherein second surface 527 has a concave curvature, wherein the relative index at second boundary 590 is approximately 1.5 or greater.

Third boundary 591 is an optical boundary having a positive power. Third boundary 591 is any optical boundary having a positive power, wherein the third surface 551 has a convex curvature.

Fourth surface 552 is an optical boundary. Fourth surface 552 is any optical boundary having a continuous surface. Optical surface 552 is any optical boundary having a continuous surface and zero optical power. Preferably, fourth surface 552 is a continuous surface, having zero optical power disposed at the image plane 512 of lens system 500 so that surface 552 is index matched to image plane 512.

Lens system 500 is configured to be object-side field limited by constructing second surface 527 as an equiangular surface. An equiangular surface is any surface for which each ray originating from a specified point on an plane (such as the object plane) impinges the surface at a single pre-selected angle. Because each ray of light from the specified point impinges the equiangular surface at a specified angle, light from points on the object plane proximate the specified point is transmitted by the equiangular surface such that the transmission as a function of position on the object plane is substantially in the shape of the transmission curve of internal reflection. If the specified angle is the critical angle of the surface, substantially all of the light incident on the equiangular surface from the specified point will be reflected by total internal reflection.

Surface 527 is any equiangular surface for which each ray originating from a specified object point impinges the surface at a single pre-selected angle. Surface 527 is any equiangular surface for which each ray originating from an object point at the object-side edge of the field impinges the surface at a single pre-selected angle α. Surface 527 is any equiangular surface for which each ray originating from a specified object point at the object-side edge of the field impinges the equiangular surface at the critical angle of the equiangular surface, such that light originating from beyond the edge of the field is reflected away from image plane 512 by total internal reflection.

A substantially equiangular surface is a surface for which each ray originating from a specified object point impinges the surface at substantially a single pre-selected angle. A substantially equiangular surface exhibits many of the qualities of an equiangular surface.

Figure 5B:
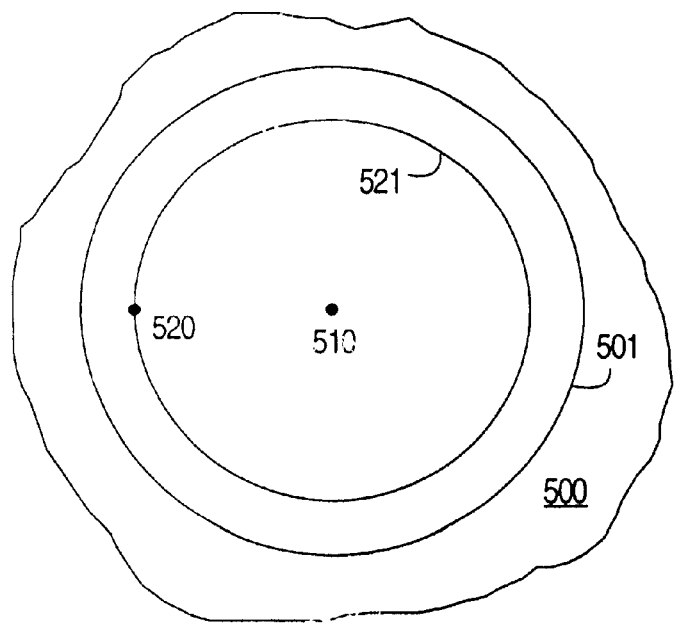
FIG. 5B is a top view of a lens system that is object-side optically field-limited.

FIG. 5B is a top view of lens system 500 taken along line 5B-5B in FIG. 5A. Perimeter 501 is the perimeter of first surface 526. The image points comprising circle 521 correspond to image points for light originating from points on the edge of the object-side field. In preferred embodiments, lens system 500 focuses light originating from points on the edge of the object-side field a distance equal to 0.375 F.–0.399 F from optical axis 510, thus limiting the field of the lens systems. F is the effective focal length of the lens system. Cases 5–9 above are example of lens systems having substantially equiangular second surfaces.

Figure 5C:
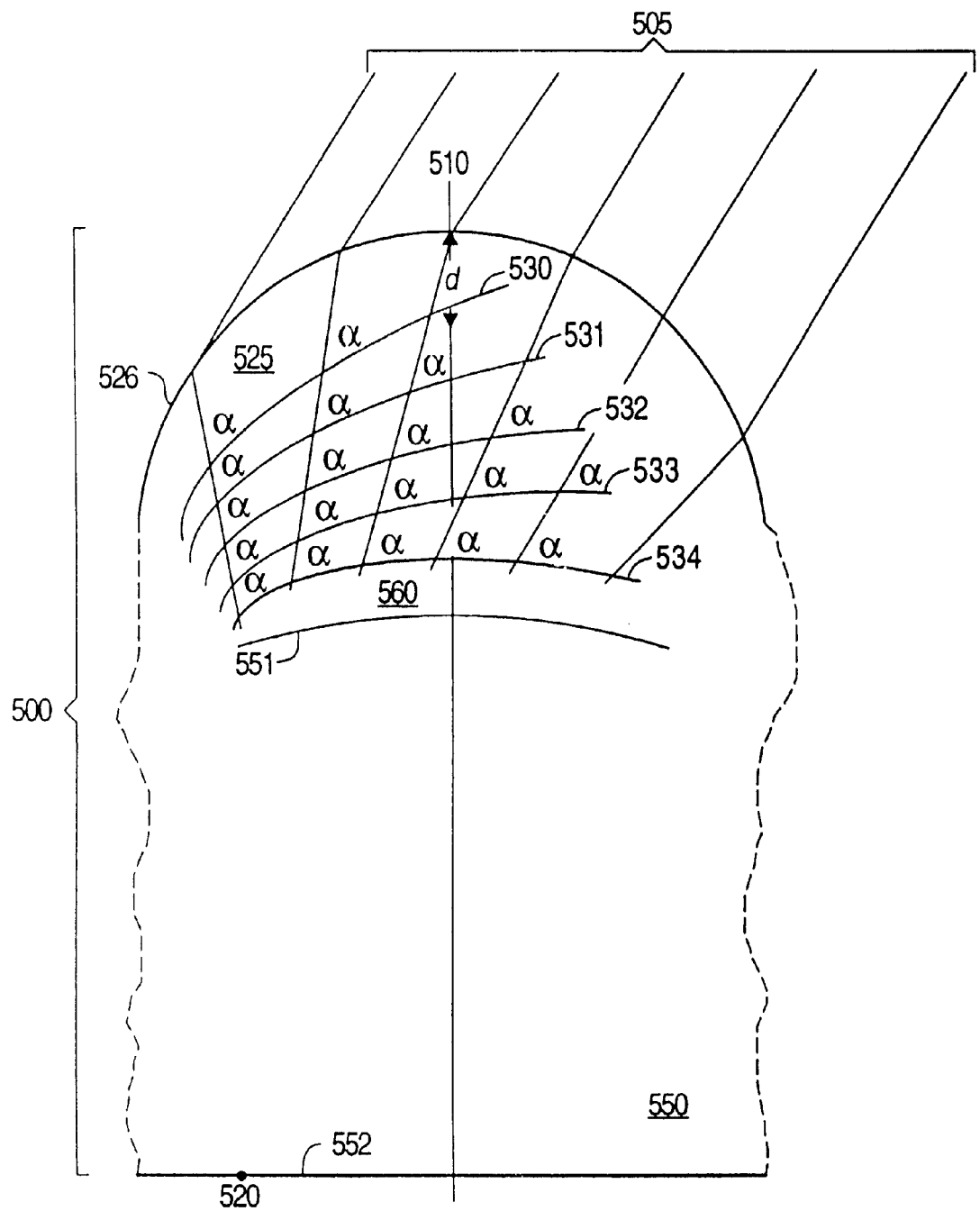
FIG. 5C is an example of cross sectional side view of a lens having an equiangular surface.
Figure 5D:
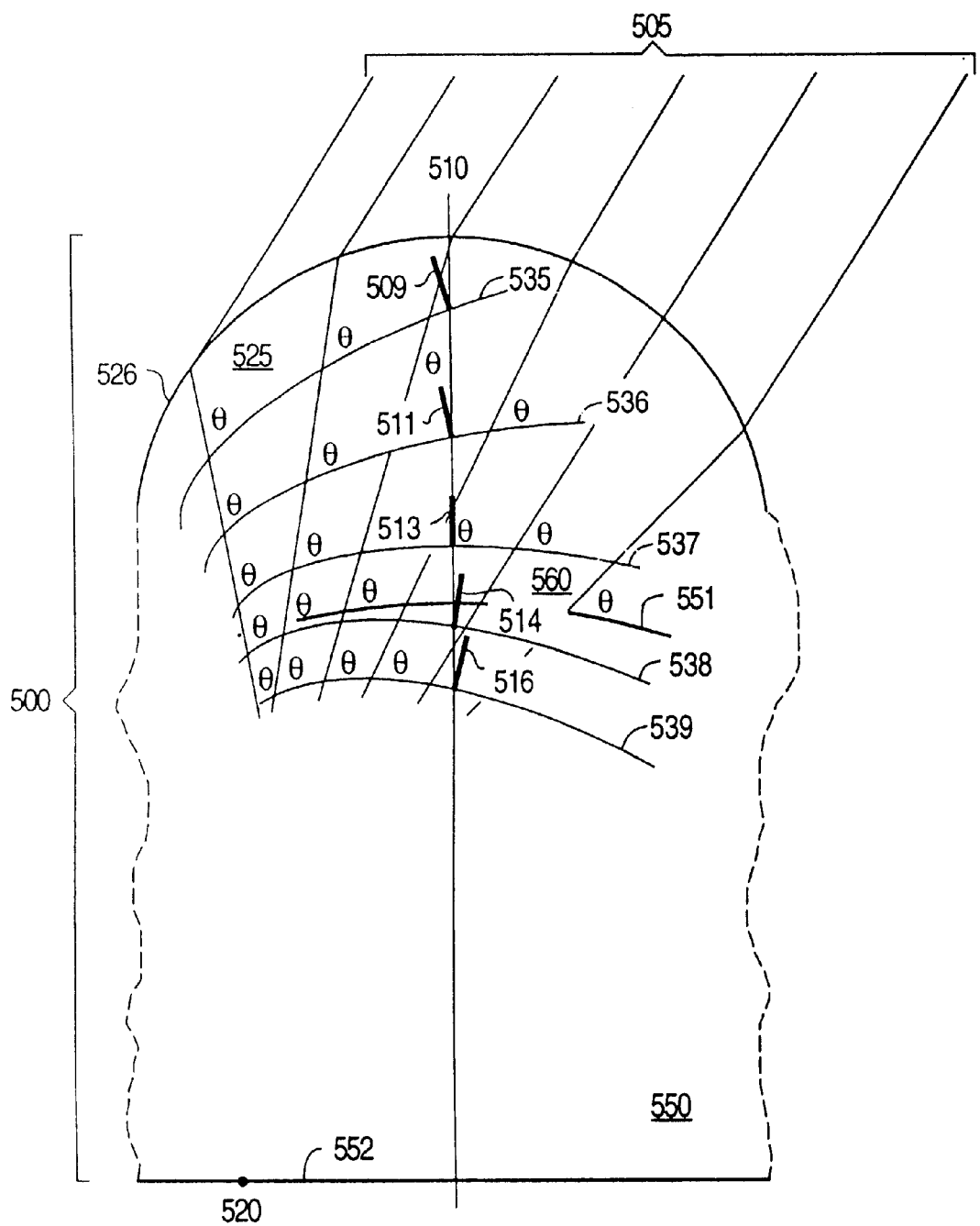
FIG. 5D is an example of cross sectional side view of a lens having an equiangular surface that is equiangular at the critical angle.
Figure 5E:
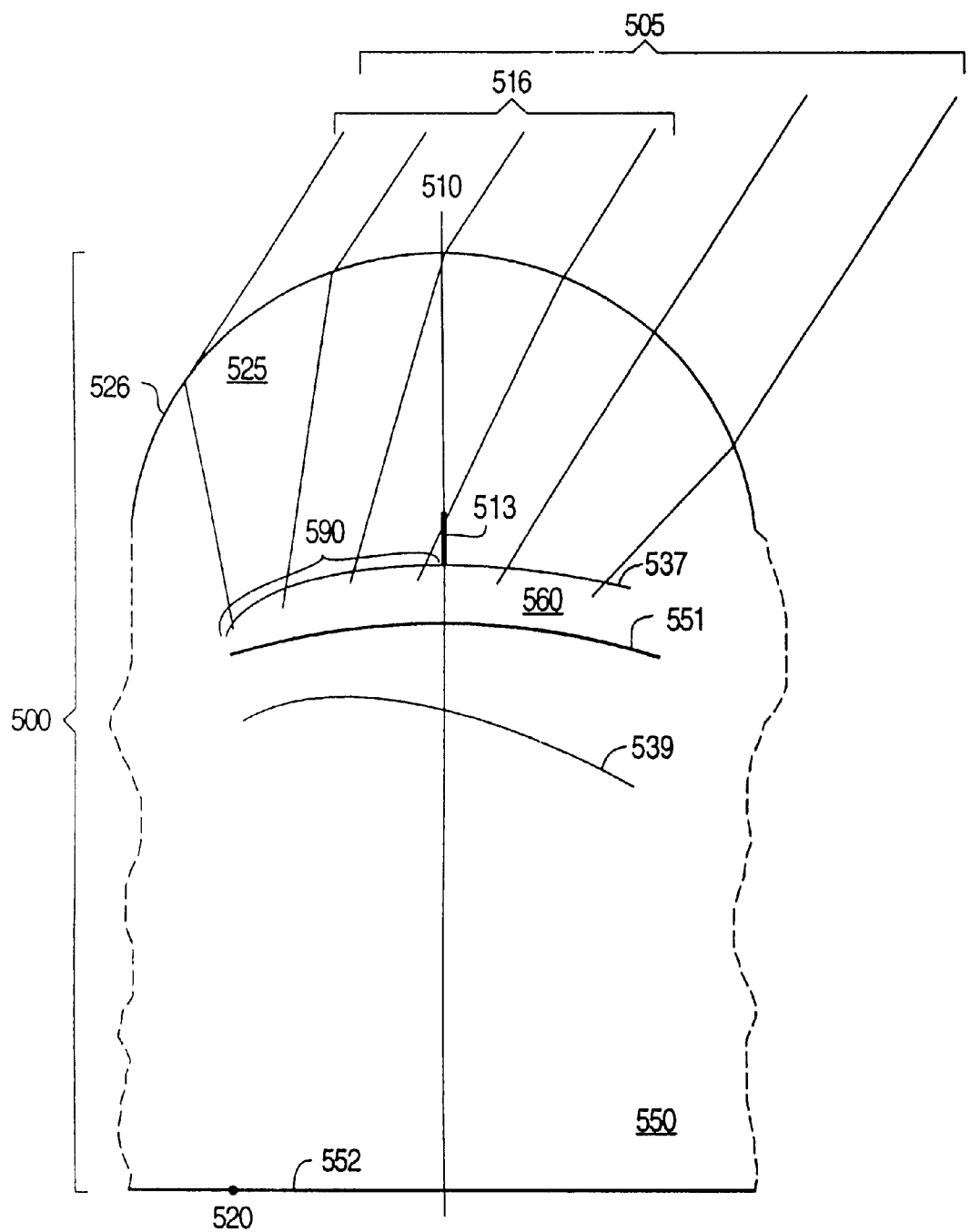
FIG. 5E is an example of cross sectional side view of a lens having an equiangular surface that is equiangular at the critical angle.

The following discussion with reference to FIG. 5C–FIG. 5E is meant to be illustrative of the design and function of an equiangular surface, such as equiangular surface 527 illustrated in FIG. 5A. The discussion is not meant to limit how an equiangular surface is designed, and all equiangular surfaces and all optical systems, which include an equiangular surface, are within the scope of this invention regardless of how the equiangular surface was designed.

FIG. 5c is a cross sectional side view of lens system 500. Light rays 505 are exemplary light rays corresponding to all rays originating from a single object point. Light rays 505 encountering lens 500 first impinge lens system 500 at first surface 526 of first lens element 525 before impinging third surface 551, region 560, and fourth surface 552.

Curves 530–534 are an exemplary subset of equiangular curves, wherein each of the curves 530–534 is an equiangular curve for rays 505. Curves 530–534 are curves for which each of a series of rays 505 impinge the curve at a pre-selected angle α. Each of the equiangular curves 530–534 is a two-dimension construct entirely in the plane including image point 520 and optical axis 510. As described below, second surface of the first lens element 525 is constructed to correspond to a selected equiangular curve for rays 505.

Each curve 530–534 is equiangular to rays 505, but is located a different distance from first surface 526 as measured along optical axis 510. For example, the distance from first surface 526 to curve 530 as measured along optical axis 510 is represented by d. It is understood that, for any object point and any chosen pre-selected angle α, an infinite number of equiangular curves exist, each curve at a different distance from first surface 526 as measured along optical axis 510.

FIG. 5D is a cross sectional side view of lens 500. Equiangular curves 535–539 is a subset of equiangular curves, wherein the curves are selected such that rays 505 impinge the equiangular curves 535–539 at the critical angle θ. As one of ordinary skill in the art would understand, the critical angle θ is defined by the index of refraction of the material of first lens 525 and the material of enclosed region 560.

Normals 509, 511, 513, 514, 516 are the normals of equiangular curves 535–539, respectively, as determined at the point at which each of the curves 535–539 crosses the optical axis 510. Normal 513 of equiangular curve 537 is parallel to optical axis 510 at the point at which curve 537 crosses the optical axis 510. Normal 513 crosses the optical axis 510 approximately at the center of curvature of surface 526.

FIG. 5E is a cross sectional side view of lens 500. Subset of rays 516 is the subset of rays 505 that crosses optical axis 510 prior to impinging equiangular curve 537. Accordingly, all rays 516 impinge equiangular curve 537 on a single side of optical axis 510.

Portion 590 is the portion of curve 537 upon which rays 516 impinge curve 537. Portion 590 is a two-dimension construct entirely in the plane including optical axis 510 and point 520. Portion 590 extends from optical axis 510 to a selected termination point 591. Termination point 591 is any point on portion 590 selected such that rays 517 and 518 do not cross one another. Rays 517 and 518 are the extrememost rays from the object point that impinge curve 537.

Second surface of first lens 525 can be constructed to be an equiangular surface by rotating a portion of any equiangular curve about optical axis 510, wherein the equiangular curve is a curve for which a series of rays from a single object point impinge the equiangular curve at a single pre-selected angle α. Second surface of first lens 525 can be constructed to be an equiangular surface by rotating a portion of an equiangular curve about optical axis 510, wherein the equiangular curve is a curve for which a series of rays from a single object point impinge the equiangular curve at a single pre-selected angle for an object point, and wherein the pre-selected angle is the critical angle. Second surface of first lens 525 is constructed to be an equiangular surface by rotating a portion 590 of equiangular curve 537 about optical axis 510, wherein the equiangular curve is a curve for which a series of rays from a single object field point impinge the equiangular curve at a single pre-selected angle for an object point, and wherein the pre-selected angle is the critical angle and the normal of the equiangular curve at the point at which for each of the curve crosses the optical axis 510 is parallel to optical axis 510.

Second surface of first lens 525 may be substantially equiangular surface, such that the angle α at which rays impinge second surface of first lens 525 are not equiangular, but are substantially equiangular thus exhibiting many of the beneficial characteristics of an equiangular surface.

A substantially equiangular surface is a surface such as a spherical or aspherical approximation of an equiangular surface that would result from optimizing optical system 500 using a lens design program, to optimize the performance according to a merit function, wherein the merit of particular lens system is a weighted average of object-side optical field limitation and other lens characteristics.

Embodiments in which rays 517 and 518 cross are within the scope of this invention. Embodiments in which rays 517 and 518 cross are useful provided the image quality of lens system 500 is not degraded such that the lens is not useful for a particular purpose.

Figure 6A:
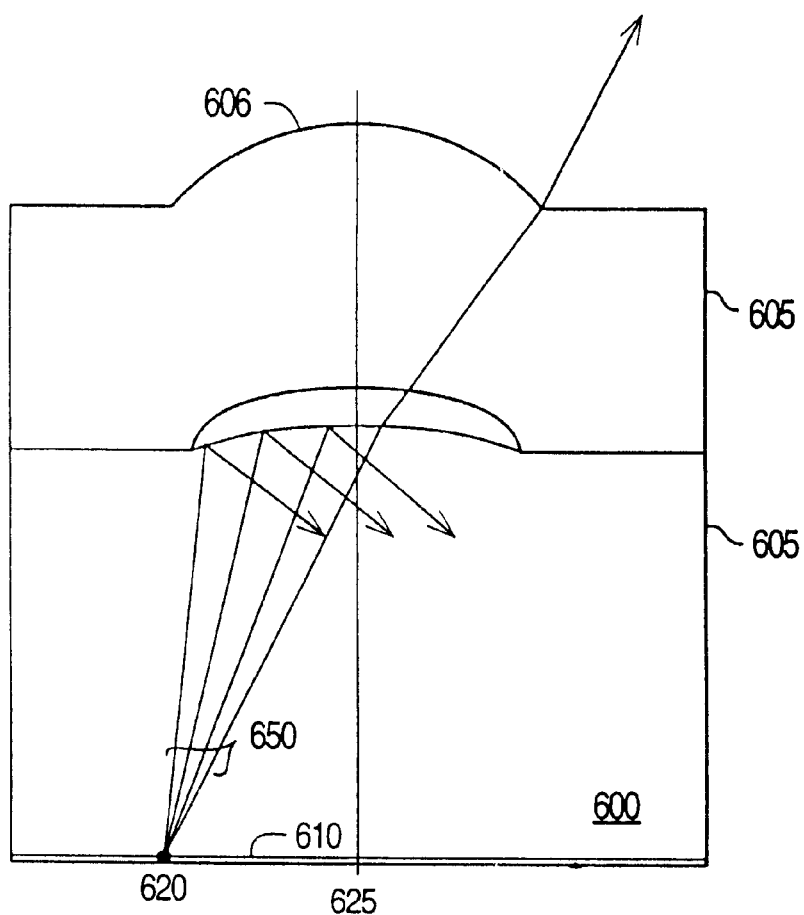
FIG. 6A is a cross sectional side view of one example of an embodiment of a discrete lens system that is image-side optically field-limited.

FIG. 6A is a cross sectional side view of one example of an embodiment of a discrete lens system 600 that is imageside optically field limited. Lens system 600 is a generic multielement lens system having one or more lens elements 605, and having a focal length F. Lens system 600 has an image plane 610, and an optical axis 625.

Light rays 650 originate from an image point 620 on image plane 610 at the edge of the image-side field. Light rays 650 are transmitted by lens system 600 to the object side of lens system 600.

An image-side optically field-limited system is any system where the image-side edges of the field of the system are determined by the optical properties of lens material of the system. An image-side optically field limited lens system is any lens system for which the image-side edge of the field is substantially determined by total internal reflection. An image-side field limited lens system is any lens system for which the image-side edge of the field is substantially determined by total internal reflection, and the transmission of light from image points in proximity to the image-side edge of the field as a function of field angle is substantially in the shape of the transmission curve of internal reflection as a function of angle of incidence. Cases 5-9 above, are examples of lens systems having an lens systems that are image-side field-limited.

Figure 6B:
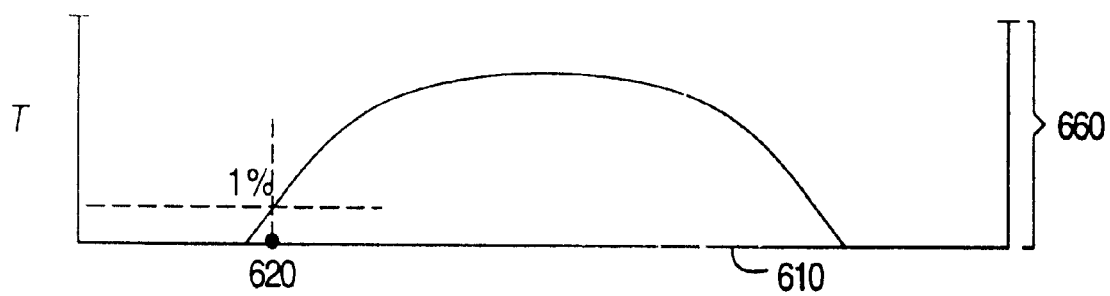
FIG. 6B is transmission curve of a image-side optically field limited lens system, as a function of location in an object plane.

FIG. 6B is a transmission curve 660 illustrating transmission T of an object-side, optically field limited lens system 600, as a function of location in image plane 610. Because point 620 corresponds to the edge of the object field, the transmission of light to point 620 is no more than 1%.

Figure 7A:
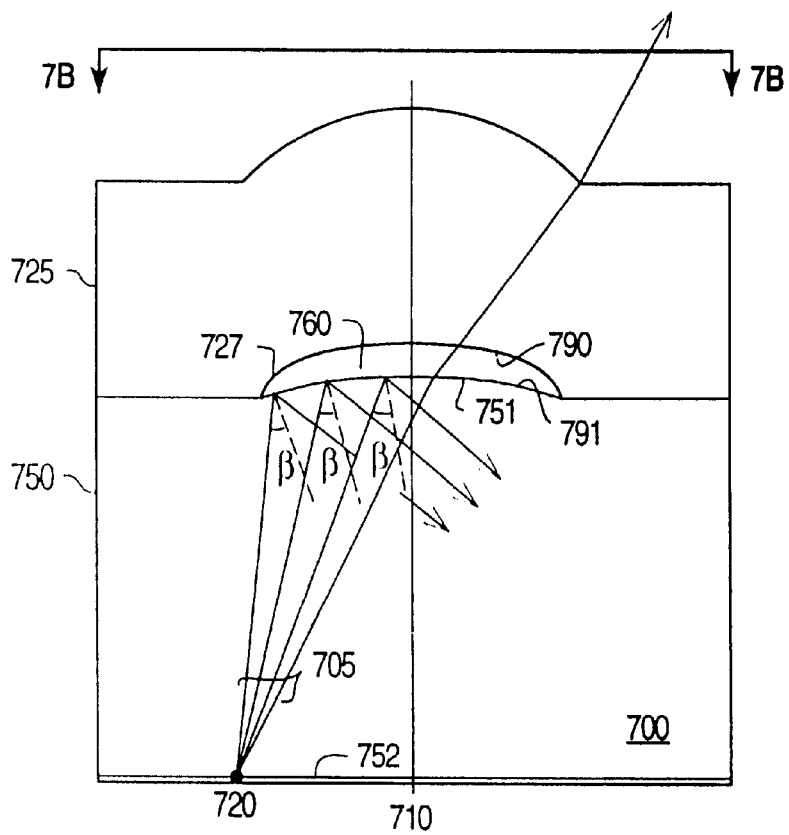
FIG. 7A is a cross sectional side view of one example of an embodiment of a lens system that is image-side optically field-limited.

FIG. 7A is a cross sectional side view of one example of an embodiment of a lens system 700 that is image-side optically field limited. Lens system 700 is any multielement optical system, which includes a first lens 725, a second lens 750, and a region 760 between lens 725 and lens 750. Lens system 700 has a focal length F, an optical axis 710, and an image plane 712. Rays of light 705 originate from an image point 720 at the edge of the image-side field.

First lens 725 has a first surface 726, a second surface 727, and is constructed of a material having a relatively high index of refraction. Second lens 750 has a first surface 751, a second surface 752 and is constructed of any material having a relatively high index of refraction. First lens 725 and second lens 750 can be constructed of any material having a relatively high index of refraction that is optically transparent. First lens 725 and second lens 750 can constructed of any material having a high index of refraction that is optically transparent at optical or infrared wavelengths. First lens 725 and second lens 750 can be constructed of any material having a relatively high index of refraction that is optically transparent at optical or infrared wavelengths, and is configurable into an optical lens element. Polycarbonate, styrene, polyamides, polysulfones, optical glasses, or infrared-transmitting materials such as are examples of materials appropriate for constructing lenses 725 and 750. It is understood that other materials having a relatively high index of refraction can be used.

Region 760 can be constructed of any material having a lower index than the material of lens 725 and lens 750. Region 760 can be void or constructed of any material having a lower index than the material of lens 725 and lens 750 that is optically transparent to optical or infrared wavelengths of light. Region 760 can be void or constructed any material having a lower index than the material of lens 725 and lens 750 that is optically transparent to optical or infrared wavelengths of light and is configurable into an optical lens element. Optical fluoropolymers are examples of appropriate low-index materials.

Lens system 700 has three optical boundaries that have non-zero optical power, first surface 726, second boundary 790 at second surface 727, and third boundary 791 at third surface 751. First surface 726 is any optical boundary having a positive power. First surface 726 is any optical boundary having a positive power and convex curvature. Second boundary 790 is an optical boundary having a negative power. Second boundary 790 is any optical boundary having a negative power, wherein second surface 727 has a concave curvature. Third boundary 791 is any optical boundary having a positive power. Third boundary 791 is any optical boundary having a positive power, wherein the third surface 751 has a convex curvature.

Fourth surface 752 is an optical boundary. Fourth surface 752 is any optical boundary having a continuous surface. Optical surface 752 is any optical boundary having a continuous surface and zero optical power. Preferably, fourth surface 752 is a continuous surface, having zero optical power disposed at the image plane 712 of lens system 700 so that fourth surface 752 is index matched to image plane 712.

Lens system 700 is configured to be image-side field limited by constructing second surface 751 as an equiangular surface for a specified point on the image plane. Because each ray of light from the specified point impinges an equiangular surface at a specified angle, light from points on the object plane proximate the specified point is transmitted by the equiangular surface such that the transmission as a function of position on the object plane is substantially in the shape of the transmission curve of internal reflection. If the specified angle is the critical angle of the surface, substantially all of the light incident on the equiangular surface from the specified point will be reflected by total internal reflection.

Surface 751 is any equiangular surface for which each ray originating from a specified image point impinges the surface 751 at a single pre-selected angle. Surface 751 is any surface 751 for which each ray originating from an image point at the image-side edge of the field impinges the surface at a single pre-selected angle $\theta$. Surface 751 is any equiangular surface for which each ray originating from a specified image point at the image-side edge of the field impinges the equiangular surface at the critical angle of the equiangular surface, such that light originating from beyond the edge of the field is reflected by total internal reflection.

Figure 7B:
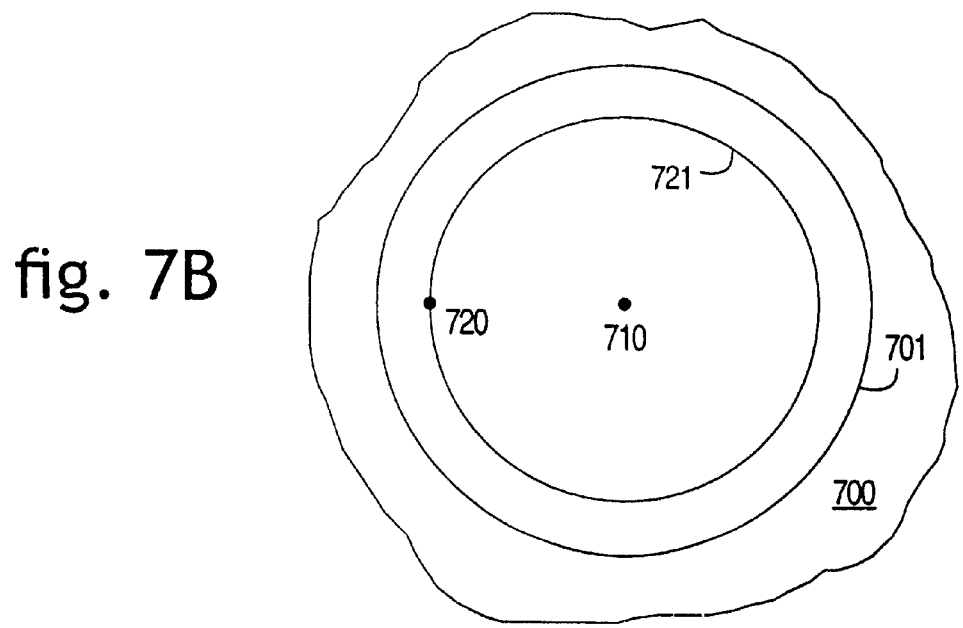
FIG. 7B is a top view of lens system that is image-side optically field-limited.

FIG. 7B is a top view of lens system 700 along line 7B—7B in FIG. 7A. Perimeter 701 is the perimeter of first surface 726 of lens system 700. The image points comprising circle 721 from the edge of the image-side field, such as point 720. In preferred embodiments of lens system 700, the image-side edge of the field is located a distance equal to 0.375 F.–0.399 F from optical axis 510, thus limiting the field of the lens systems. F is the effective focal length of the lens system. Cases 5–9 above are example of lens systems having substantially equiangular third surfaces.

Figure 7C:
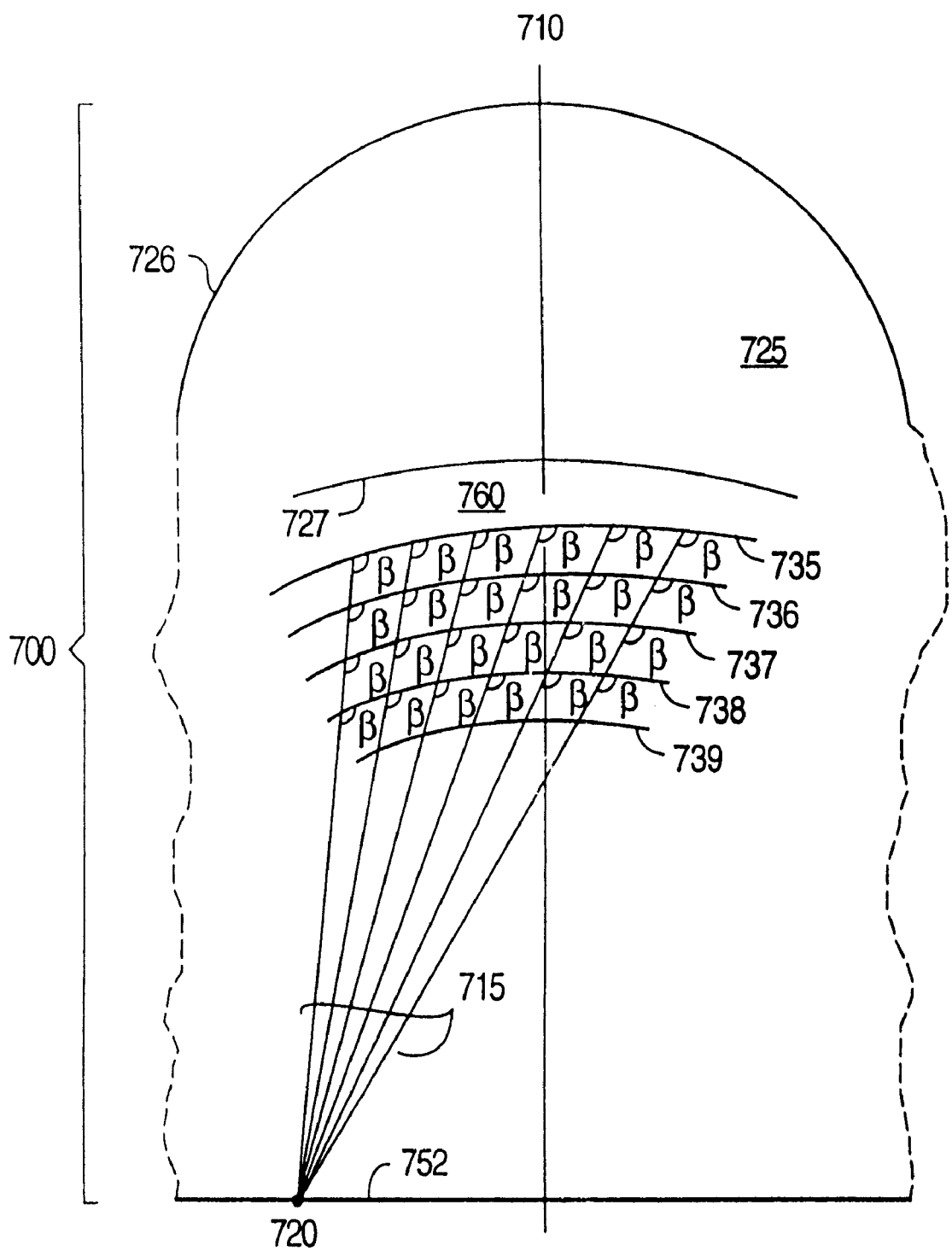
FIG. 7C is a cross sectional view of a lens system having an equiangular surface.
Figure 7D:
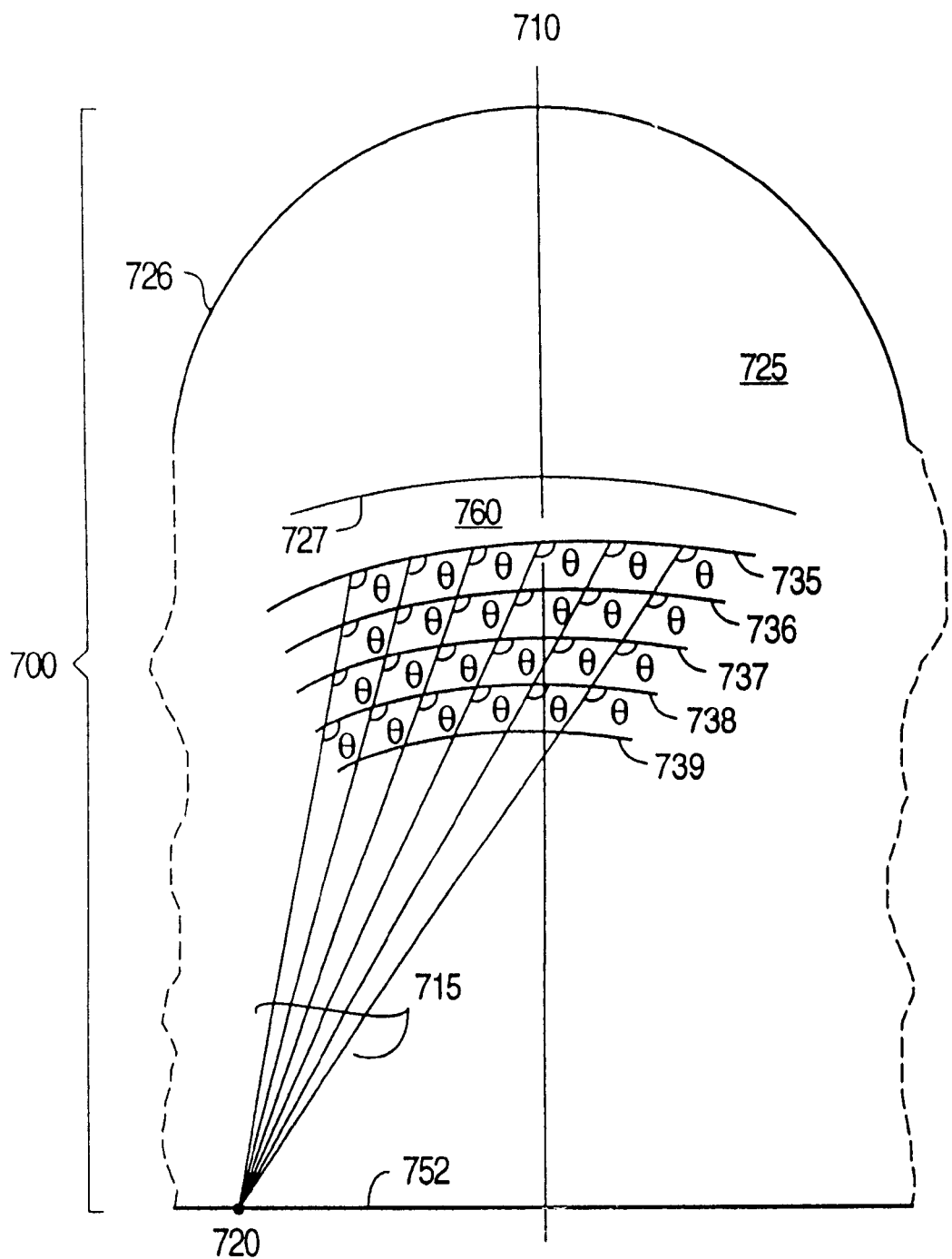
FIG. 7D is a cross sectional view of a lens system having an equiangular surface that is equiangular at the critical angle.

The following discussion with reference to FIG. 7C–FIG. 7D is meant to be illustrative of the design and function of equiangular surface 751 of FIG. 7A. The discussion is not meant to limit how an equiangular surface is designed, and all equiangular surfaces and all optical systems, which include an equiangular surface, are within the scope of this invention regardless of how the equiangular surface was designed.

FIG. 7C is a cross sectional side view of lens system 700. Light rays 715 are exemplary light rays corresponding to all rays originating from a single image point 720. Light rays 715 encountering lens 700 first impinge lens system 700 at surface 752. For illustrative purposes, fourth surface 752 is a planar surface having zero optical power, disposed at the image plane 712 of lens system 700, and index matched to image plane 712.

Curves 730–734 are an exemplary subset of equiangular curves, wherein each of the curves 730–734 is an equiangular curve for rays 715. Curves 730–734 are curves for which each of a series of rays 715 impinge the curve at a pre-selected angle $\beta$. Each of the equiangular curves 730–734 is a two-dimension construct entirely in the plane including line point 720 and optical axis 710. As described below, second surface 727 is constructed to correspond to a specific equiangular curve for rays 715.

Each curve 730-734 is equiangular to rays 715, but is located a different distance from second surface 727 as measured along optical axis 710. For example, the distance from first surface 726 to curve 730 as measured along optical axis 710 is represented by d. It is understood that, for any object point and any chosen pre-selected angle $\beta$, an infinite number of equiangular curves exist, each curve at a different distance from first surface 726 as measured along optical axis 710.

FIG. 7D is a cross sectional side view of lens 700. Lens system 700 has a first lens 725 having a first surface 726 and a second surface 727. Second lens 750 has a second surface 752. Equiangular curves 735–739 is a subset of equiangular curves, wherein the curves are selected such that rays 715 impinge the equiangular curves 735-739 at the critical angle $\theta$. As one of ordinary skill in the art would understand, the critical angle $\theta$ is defined by the index of refraction of the material of second lens 750 and the material of enclosed region 760.

A first surface of second lens 750 can be constructed to be a substantially equiangular surface by selecting a surface that is rotationally symmetric about optical axis 710, which approximates the curvature of any of the equiangular curve 735-739, wherein the first surface of the second lens 750 is a surface for which a series of rays 715 from a single object point impinge the first surface of second lens 750 at substantially a preselected angle. A first surface of second lens 750 can be constructed to be a substantially equiangular surface by selecting a surface approximating the curvature of any of the equiangular curve 735–739, and having its vertex coincide with optical axis 710, wherein the first surface of the second lens 750 is a surface for which a series of rays 715 from a single object point impinge the first surface of second lens 750 at approximately a preselected angle, and wherein the pre-selected angle is the critical angle $\theta$.

Cases 1–4 below are examples of three-element high acuity lens system 100, as discussed with reference to FIG. 3a above. Any of the aspherical surfaces are appropriately constructed of conic or higher order aspheric polynomials.

Case 1
Materials: polycarbonate/fluoropolymer/polycarbonate    Indices: 1.586/1.370/1.586
f/#: 1.16    Object distance: −25 mm (afocal)    Distortion: −3.6%

| | | Surface Data: | | | | | Aspheric terms - constant/exponent: | | | |
|---|---|---|---|---|---|---|---|---|---|---|
| # | Type | Radius | Thickness | Aperture | Field | CC | AD/e | AE/e | AF/e | AE/e |
| L1 | Sphere | 0.165 | 0.165 | 0.125 | | — | — | — | — | — |
| L2 | Asphere | 0.220 | 0.023 | 0.091 | | −20.000000 | 80.000000 | 4.9341e4 | 6.0263e5 | −2.8e8 |
| L3 | Sphere | 0.240 | 0.243 | 0.091 | | −14.096864 | −139.955324 | 1.7441e4 | 1.7476e6 | −4.5e8 |
| IP | Plane | — | — | 0.125 | 50° | | | | | |

Case 2
Materials: polycarbonate/fluoropolymer/polycarbonate    Indices: 1.586/1.360/1.586
f/#: 1.5    Object distance: infinite    Distortion: <1%

Surface Data:    Aspheric terms -constant/exponent:

| # | Type | Radius | Thickness | Aperture | Field | CC | AD/e | AE/e | AF/e | AG/e |
|---|---|---|---|---|---|---|---|---|---|---|
| L1 | Sphere | 0.105 | 0.105 | 0.080 | | — | — | — | — | — |
| L2 | Asphere | 0.133 | 0.021 | 0.037 | (stop) | +5.5 | — | — | — | — |
| L3 | Asphere | 0.112 | 0.150 | 0.045 | | −4.3 | — | — | — | — |
| IP | Plane | — | — | 0.075 | 48° | | | | | |

Case 3
Materials: polycarbonate/fluoropolymer/polycarbonate    Indices: 1.586/1.360/1.586
f/#: 1.9    Object distance: infinite    Distortion: −5%

| | | Surface Data: | | | | | Aspheric terms: constant/exponent | | | | |
|---|---|---|---|---|---|---|---|---|---|---|---|
| # | Type | Radius | Thickness | Aperture | Field | V | K | A | B | C | D |
| L1 | Sphere | 0.1040 | 0.1040 | 0.0896 | | — | — | — | — | — | — |
| L2 | Asphere | (V) | 0.0215 | 0.1320 | (stop) | 6.00467387 | −1.025853 | −4.63382e2 | 4.93597e5 | −2.66712e7 | 0 |
| L3 | Asphere | (V) | 1.5882 | 2.0000 | | 8.32798928 | −14.096864 | −5.54914e2 | 1.34159e5 | 7.37554e6 | 0 |
| IP | Plane | — | — | 0.1936 | 60° | | | | | | |

Case 4
Materials: polycarbonate/fluoropolymer/polycarbonate    Indices: 1.586/1.370/1.586
f/#: 2.8    Object distance: 1000 mm    Distortion: −0.4%

| | | Surface Data: | | | | | Aspheric term: | | | |
|---|---|---|---|---|---|---|---|---|---|---|
| # | Type | Radius | Thickness | Aperture | Field | CC | AD/e | AE/e | AF/e | AE/e |
| L1 | sphere | 2.900 | 2.970 | 1.000 | | — | — | — | — | — |
| L2 | asphere | 2.970 | 0.107 | 0.910 | | — | −0.044859 | 0.089832 | 0.011457 | −0.052 |
| L3 | sphere | 6.600 | 5.440 | 0.910 | | −11.000000 | −0.052175 | 0.049907 | 0.004105 | −0.030 |
| IP | plane | — | — | 1.000 | 20° | | | | | |

Cases 5–9 are examples of two-element high acuity lens systems 200 as discussed with reference to FIG. 3b above.

Any of the aspherical surfaces are appropriately constructed of conic or higher order aspheric polynomials.

Case 5
Materials: polycarbonate/air/polycarbonate  Indices: 1.586/1.000/1.586
f/#: 1.13  Object distance: −25 mm (afocal)  Distortion: −3.3%

| # | Type | Radius | Thickness | Aperture | Field | CC | AD/e | AE/e | AF/e | AE/e |
|---|------|--------|-----------|----------|-------|-----|------|------|------|------|
| L1 | sphere | 0.165 | 0.165 | 0.125 | | — | — | — | — | — |
| L2 | asphere | 0.23 | 0.013 | 0.098 | | +2.95 | 30.088684 | — | 1.3174e5 | 6.0e7 |
| L3 | sphere | 0.22 | 0.257 | 0.098 | | −1.00 | — | — | — | 2.0e7 |
| IP | plane | — | — | −0.125 | 50° | | | | | |

Surface Data:  Aspheric terms - constant/exponent:

Case 6
Materials: polycarbonate/air/polycarbonate  Indices: 1.586/1.000/1.586
f/#: 1.5  Object distance: infinite  Distortion: −4%

Surface Data:  Aspheric terms:

| # | Type | Radius | Thickness | Aperture | Field | CC | AD/e | AE/e | AF/e | AG/e |
|---|------|--------|-----------|----------|-------|-----|------|------|------|------|
| L1 | sphere | 0.080 | 0.080 | 0.070 | | — | — | — | — | — |
| L2 | asphere | 0.097 | 0.012 | 0.031 | (stop) | +3.37 | — | — | — | — |
| L3 | sphere | 0.103 | 0.130 | 0.044 | | — | — | — | — | — |
| IP | plane | — | — | 0.065 | 51.2° | | | | | |

Case 7
Materials: polycarbonate/air/polycarbonate  Indices: 1.586/1.000/1.586
f/#: 2.0  Object distance: infinite  Distortion: −3%

Surface Data:  Aspheric terms:

| # | Type | Radius | Thickness | Aperture | Field | CC | AD/e | AE/e | AF/e | AG/e |
|---|------|--------|-----------|----------|-------|-----|------|------|------|------|
| L1 | sphere | 0.920 | 1.000 | 0.750 | | — | — | — | — | — |
| L2 | asphere | 0.980 | 0.190 | 0.290 | (stop) | +3.8 | — | — | — | — |
| L3 | asphere | 1.310 | 1.620 | 0.430 | | +2.9 | — | — | — | — |
| IP | plane | — | — | 0.670 | 43° | | | | | |

Case 8
Materials: polycarbonate/air/polycarbonate  Indices: 1.586/1.000/1.586
f/#: 1.5  Object distance: infinite  Distortion: −5%

Surface Data:  Aspheric terms:

| # | Type | Radius | Thickness | Aperture | Field | V | K | A | B | C | D |
|---|------|--------|-----------|----------|-------|---|---|---|---|---|---|
| L1 | sphere | 0.0800 | 0.0800 | 0.0960 | | — | — | — | — | — | — |
| L2 | asphere | (V) | 0.0106 | 0.0867 | (stop) | 9.032 | +3.958 | — | — | — | — |
| L3 | asphere | (V) | 0.1293 | 0.1600 | | 8.923 | −2.897 | — | — | — | — |
| IP | plane | — | — | 0.2043 | 61° | | | | | | |

Case 9
Materials: polycarbonate/air/polycarbonate  Indices: 1.586/1.000/1.586
f/#: 1.4  Object distance: infinite  Distortion: −4%

Surface Data:  Aspheric terms:

| # | Type | Radius | Thickness | Aperture | Field | V | K | A | B | C | D |
|---|------|--------|-----------|----------|-------|---|---|---|---|---|---|
| L1 | Sphere | 1.0162 | 1.0162 | 1.200 | (stop) | — | — | — | — | — | — |
| L2 | Asphere | (V) | 0.1162 | 1.2100 | (stop) | 0.60331747 | +6.376347 | — | — | — | |

-continued

Case 9
Materials: polycarbonate/air/polycarbonate  Indices: 1.586/1.000/1.586
f/#: 1.4  Object distance: infinite  Distortion: −4%

Surface Data: | | | | | | Aspheric terms: | | | | |
---|---|---|---|---|---|---|---|---|---|---|---
| Type | Radius | Thickness | Aperture | Field | V | K | A | B | C | D
L3 | Asphere | (V) | 1.5882 | 2.0000 | | 0.65757840 | −5.545224 | — | — | — | —
IP | Plane | — | — | 1.6279 | 48.0° | | | | | |

Having discussed the performance properties of individual lens system according to, the present invention, the lens systems will now be implemented in lens arrays, with particular attention paid to applications in three dimensional imaging systems.

Figure 8:
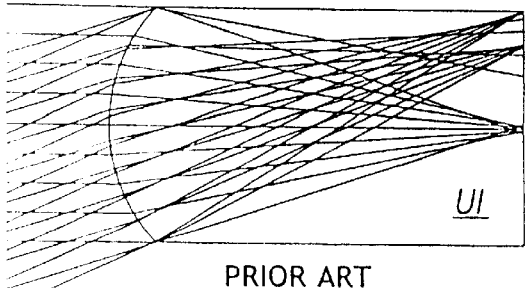
FIG. 8 is a ray trace of an uncorrected lens system.
Figure 9:
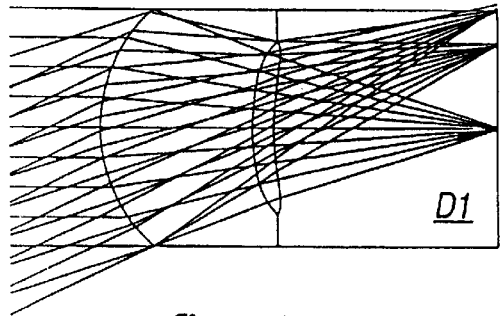
FIG. 9 is a ray trace one example of a three-element lens system according to the present invention.
Figure 10A:
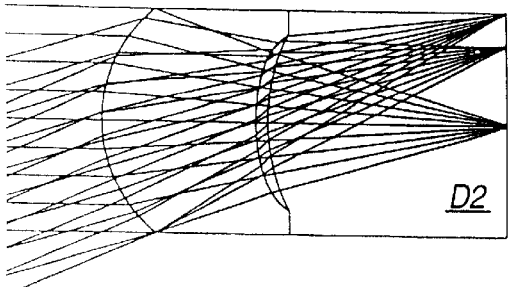
FIG. 10a is a ray trace of one example of a two element lens system according to the present invention.
Figure 11:
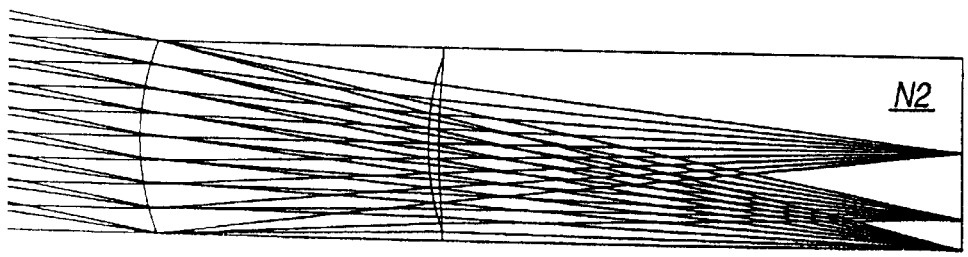
FIG. 11 is lens system according to the present invention having finite conjugates.

FIG. 8 is a cross sectional side view of an uncorrected lens system that illustrates aberration in uncorrected arrays as described in FIG. 1A. FIG. 9 is a cross sectional side view of the three-element lens system described in Case 1 that illustrates correction of aberration present in the uncorrected lens system illustrated in FIG. 8. FIG. 10A is a cross sectional side view of the two-element lens system described in Case 5 that illustrates correction of aberration present in the uncorrected lens system illustrated in FIG. 8. FIG. 11 is a cross sectional side view of the three-element lens system described in Case 4 that illustrates correction of aberration present in the uncorrected lens system illustrated in FIG. 8.

Figure 10B:
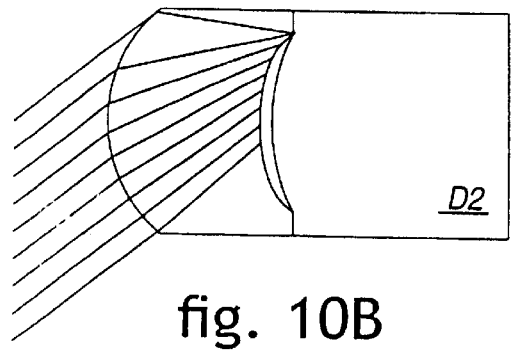
FIG. 10B is a ray trace illustrating field limitation.

Cases 1, 4, and 5 represent a special condition in which the L2 and L3 geometries meet at a common perimeter, and in which that common perimeter encompasses all rays in the field. Points 1001 in FIG. 10B illustrate points along the common perimeter. It may be understood that optical surface L3 contacts surface L2 such that surface L2 and L3 self align.

Figure 12:
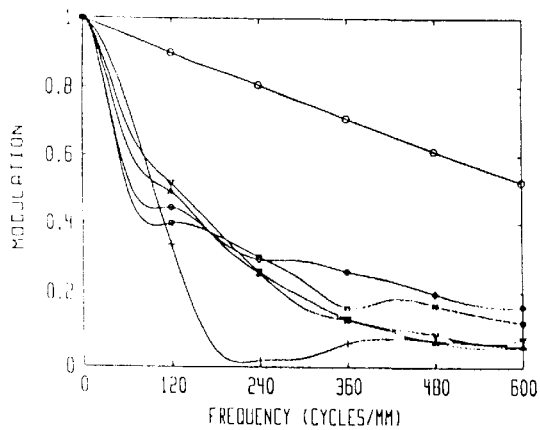
FIG. 12 is an MTF of an uncorrected lens system.
Figure 13:
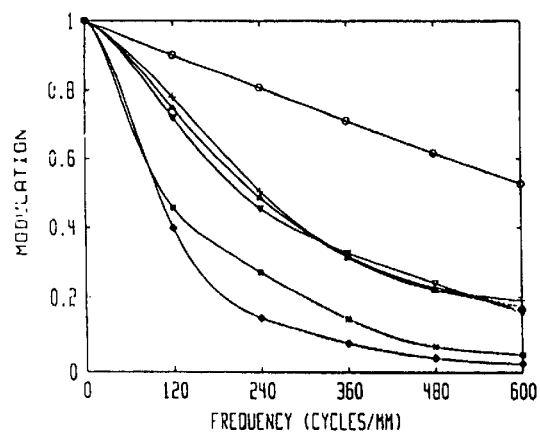
FIG. 13 is an MTF of one example three-element lens system according to the present invention
Figure 14:
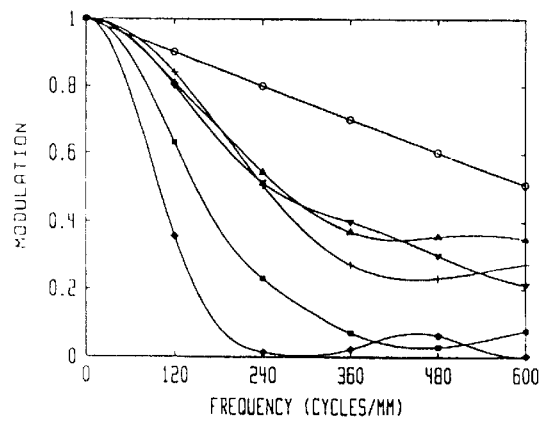
FIG. 14 is an MTF of one example of a two-element lens system according to the present invention.
Figure 15:
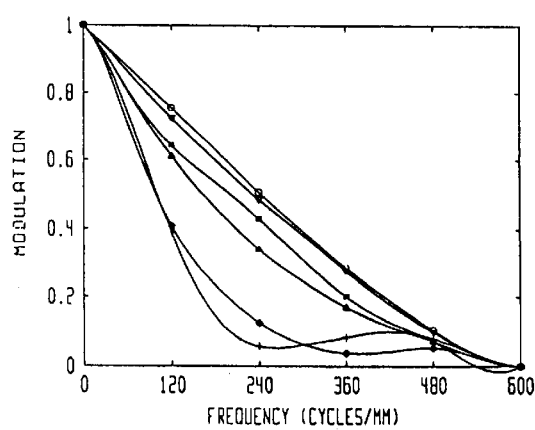
FIG. 15 is an MTF of one example of a finite conjugate lens system according to the present invention.

Relative performance may be quantified by comparison of the MTF of the uncorrected lens systems to that for lens systems formed according to the invention. FIG. 12 represents the MTF for the monolithic array, while FIG. 13 and FIG. 14 show the MTF output for Case 7 and Case 8, respectively. Each MTF analysis shown includes five separate plots: on-axis(0), and saggital and tangential plots at 70% (0.7 r) and 100% (1.0 r) of the targeted image fields. The location of the sampled radii on the image plane may be understood by reference to the unevenly broken lines in FIG. 25. FIG. 12 indicates that array U1 will have a modulated contrast of 50% at approximately 100 cycles/mm. At the extremity of their fields, it may be seen that D1 and D2 arrays offer only a marginal improvement over the uncorrected array. However, FIG. 13 indicates that, within the central 70% field radius of fluoropolymer-filled D1 array of Case 7, a 50% modulation occurs a spatial frequency of no less than 230 cycles/mm. FIG. 14 shows that in the air-filled D2 array of Case 8, a 50% modulation occurs at a frequency of 240 cycles/mm. In both the D1 and D2 arrays, acuity peaks at approximately the mid-field (0.5) location, where the spatial frequency at 50% modulation reaches 300 cycles/mm.

Figure 16A:
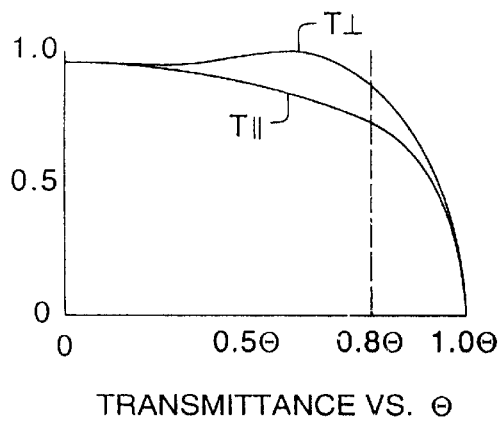
FIG. 16A is transmittance curve as a function of the critical angle.
Figure 16B:
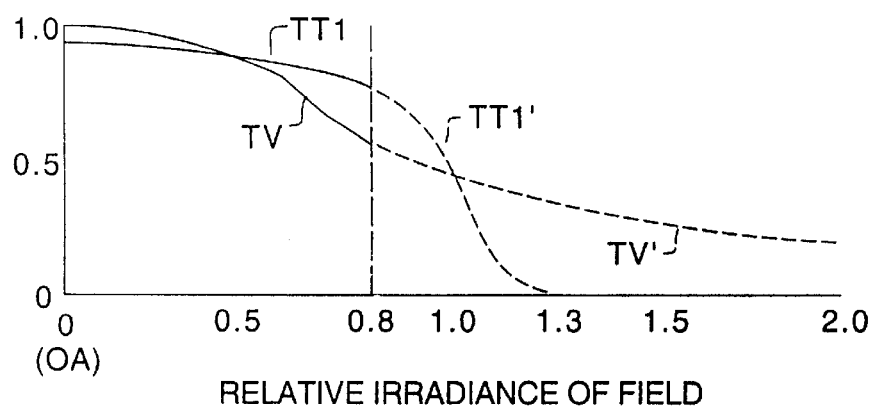
FIG. 16B is a curve illustrating transmittance through an optically field limited system and a vignetted lens system.
Figure 16C:
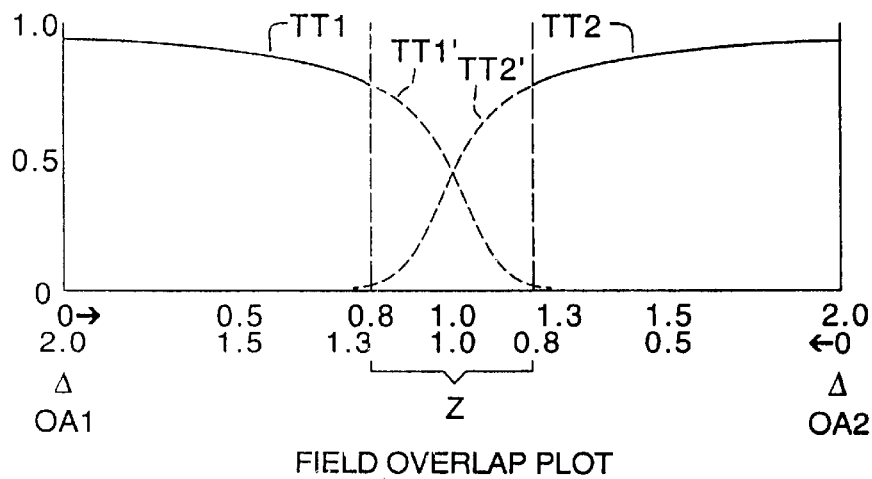
FIG. 16C is a plot of two overlapping image fields in a lens array according to the present invention.

FIG. 10B is a cross sectional side view of the two-element lens system described in Case 5 that illustrates optical field limitation. FIG. 10B shows the computational confirmation of TIR at L3, here occurring at a half-field angle of 38.5°. FIG. 16A illustrates transmittance as of the critical angle θ for parallel and perpendicularly polarized light. FIG. 16A illustrates that transmittance drops of abruptly beyond 80% of the critical angle. FIG. 16B illustrates that irradiance of the field to be electively masked at 80% of a predetermined field angle. In FIG. 16B line TV illustrates the irradiance of the field through a vignetted aperture according to the prior art. Line TV' indicates the extension of line TV beyond the masked field. Line TT1 indicates the irradiance of the field as described in FIG. 10A and FIG. 10B. Line TT1' indicates the continuation of lens TT1 beyond the field that has been electively masked at 80% of the field. FIG. 16B further illustrates that the irradiation of the image field self terminates abruptly when a lens system is formed according to the present invention. Furthermore, by comparing line TT1 and extension TT1' it is apparent that the irradiance of the field in a lens system according to the present invention closely conforms to the transmittance curves in FIG. 16A.

The principles described above may be applied to lens arrays and discrete lens systems. Although the lens array in the figures below are illustrated as arrays of lens systems having a selected, finite number of lens systems, it is to be understood that any lens arrays comprising an association of two or more lenses systems, wherein the lens systems process light in parallel, are within the scope of the invention.

In specific embodiments of the invention described the principle of optical field limitation and aberration correction will be applied. A specific embodiment described below relates to the capture, reproduction, and display of three-dimensional images. The invention provides a unique geometrical condition in which real images formed by the microlenses are each confined within an absolute perimeter, and in furthermore in which the efficiency of the TIR-induced falloff rate at the image perimeters approaches its theoretical maximum. Furthermore, total internal reflection may be used to restrict the angular emission during reproduction of microimages from a first lens array system to a second lens array system. In the following discussion it will be demonstrated that optical crosstalk can be effectively eliminated.

Figure 17:
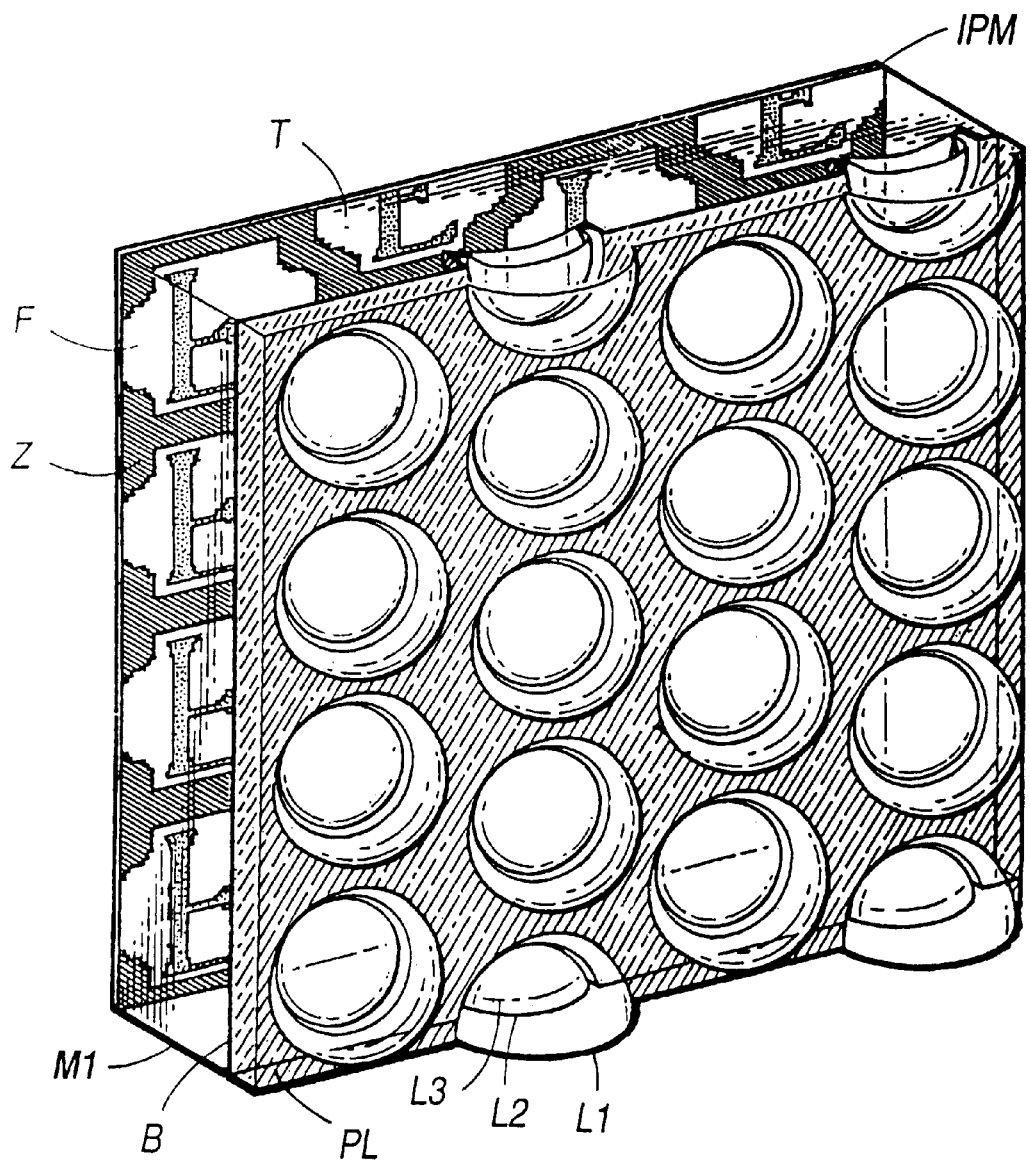
FIG. 17 is a perspective view an optically field limited lens array.

Referring now to the figures illustrating embodiments of the invention, FIG. 17 shows a perspective view of master array M1. In the figure, refractive effects are ignored in order to reveal the structural features of the array. FIG. 18A generally illustrates the geometry of master array M1, and shows how M1 is assembled from outer array A1 and inner array A2. The sectional view shown in FIG. 19A is taken along the axis of nearest approach of the perimeters of the discrete microlenses. This sectional axis is indicated by arrows in FIG. 24.

Figure 18:
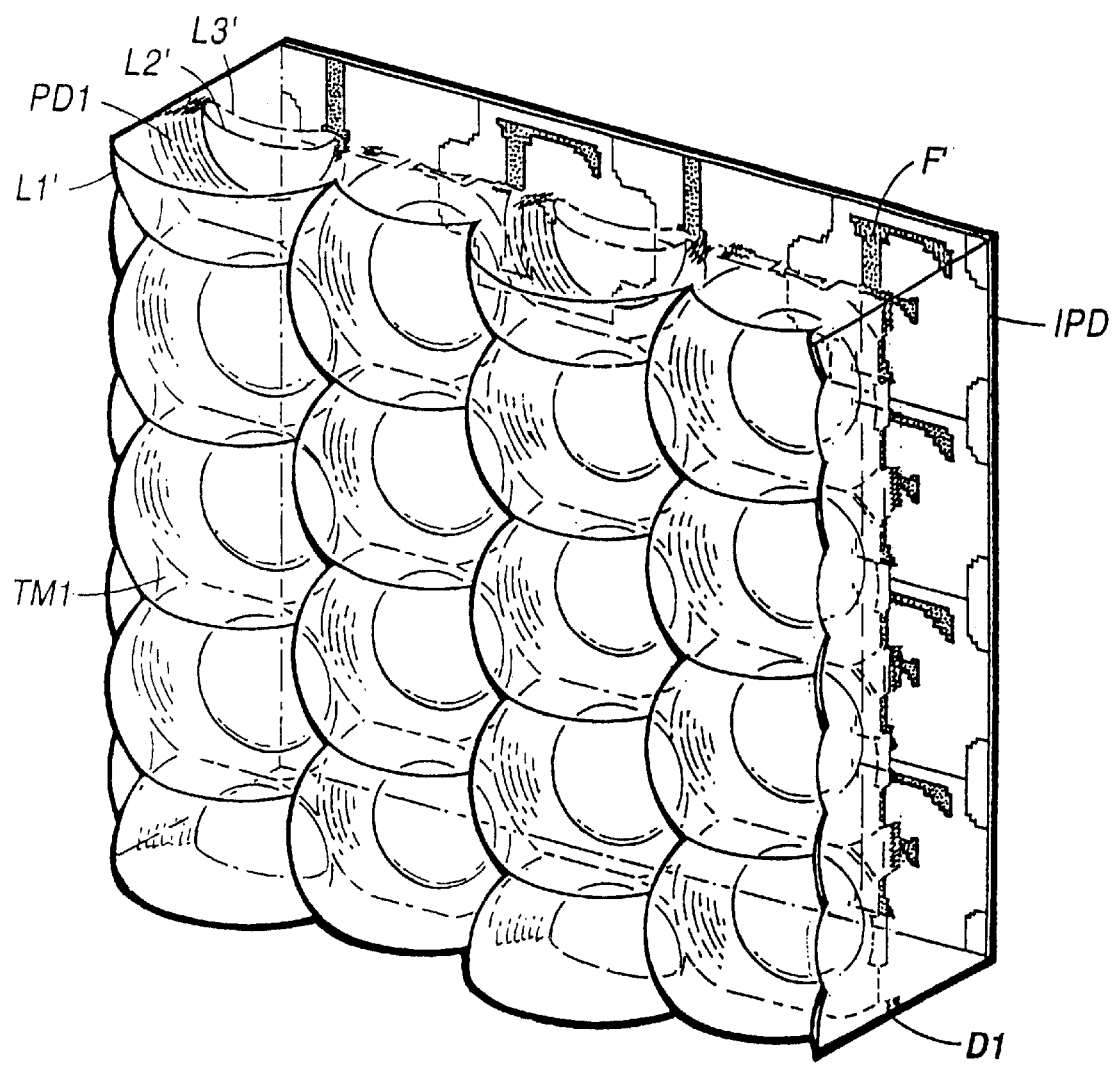
FIG. 18 is a perspective view of a three-element lens array.
Figure 19A:
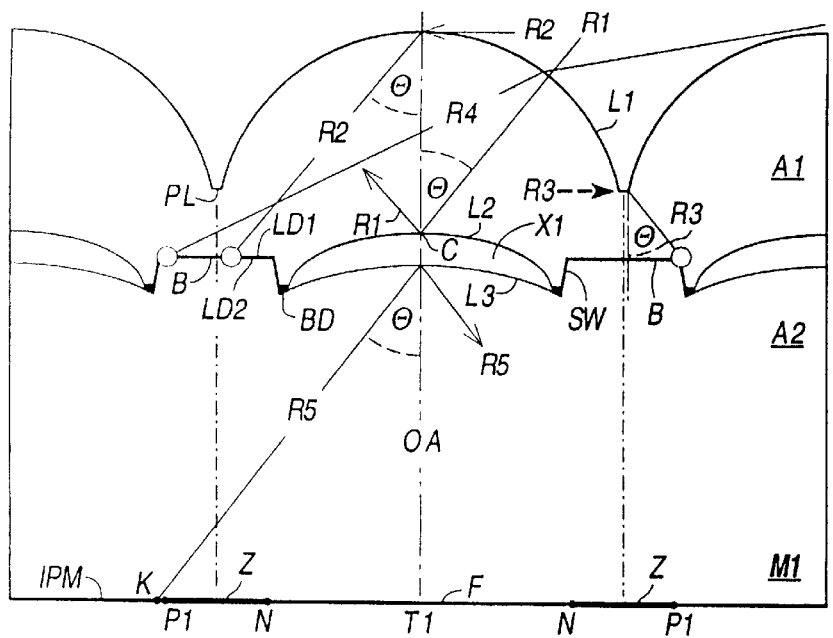
FIGS. 19A–19D are cross sectional side views of embodiments of two-element lens system according to the present invention.

FIG. 18 shows a perspective view of display array D1 compatible with master arrays. FIG. 20A shows a schematic section of D1. Internal interstices in display arrays can optionally include prismatic diffusers PD1 to internally distribute light. In order to best illustrate these prismatic interstitial reliefs, the sectional axis of FIGS. 20A and 20B is at 90° to that chosen for FIGS. 19A through 19D. A1' and A2' indicate outer and inner array components analogous to those in M1.

In the invention, a particular hexagonal lens layout allows microimages of various proportions to be efficiently tiled on the focal plane. In the following detailed discussion, the microimage tiling pattern may be seen to differ from the lens tiling. The horizontal range can be extended using an irregular microimage profile so that a bias is given to the horizontal axis. The bias is sufficient to accommodate the added dimension demanded by binocular vision, without reduction of the vertical range, and extends the effective viewing field by about 10°, without introducing the aberrations that would be implicit in a larger lens aperture. The irregular hexagon elected also avoids the irrational numbers implied by a conventional hexagon and allows the use of square pixels and data blocks.

FIGS. 19A through FIG. 19D each show first refractive boundaries L2 conformed to the equiangular geometry described above. FIG. 19A, illustrates one embodiment of a master array. Prior to the assembly of the A1 and A2 into master array M1, light-blocking cement B is applied to raised lands LD2 on A2. On assembly, LD2 meets recessed land LD1, forcing cement onto sidewalls SW, and leaving cement overflow BD in non-critical areas. Lens interstices are thus made substantially opaque.

Master array M1, in FIG. 19A, was designed with particular attention to the critical angle θ OA marks the optic axis of the lens cell. C is the center of curvature of L1. T1 is an image tile of irregular profile, which is described in detail in FIGS. 22 through 25. Points N represent the symmetrical limits of the tile. Letter F schematically represents any graphic pattern within the image tile, e.g., a projected real image or a developed photographic emulsion.

Four specific circumstances in which the critical angle bears on array performance, characterized by rays R1 through R5, are shown in FIG. 19A. This reflective effect is represented schematically by the ray R1; all rays arriving on L2 at angles greater than θ will be reflected away. The total reflection will occur not just at the optic axis, but virtually simultaneously for all rays associated with that incident angle. The critical angle within polycarbonate (n=1.586) is about 39°. R1 through R4 indicate the behavior of rays which fall outside the central focal field. Mating interstitial lands LD1 and LD2 are formed respectively on component arrays A1 and A2, and are devised to absorb R2, R3, and R4. In FIGS. 19A and 19C, a circular ray terminus represents absorbed light. Ray R5 emitted from point K beyond image field perimeter P1 is deflected by TIR at L3.

Figure 19B:
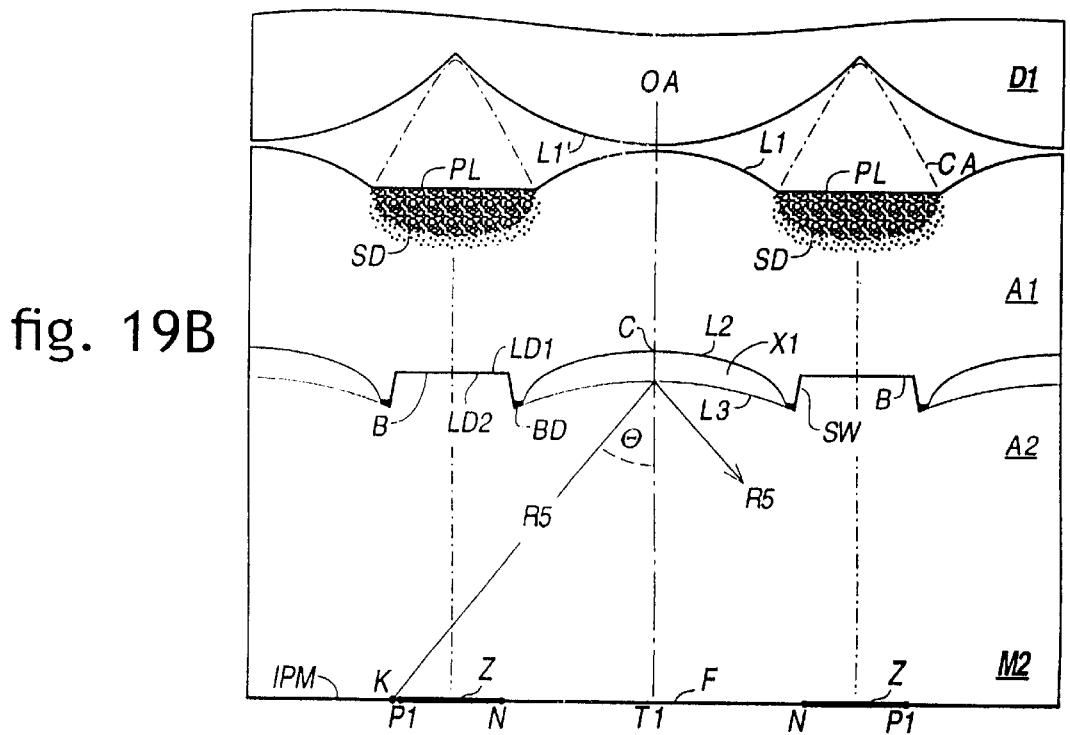
Figure 19C:
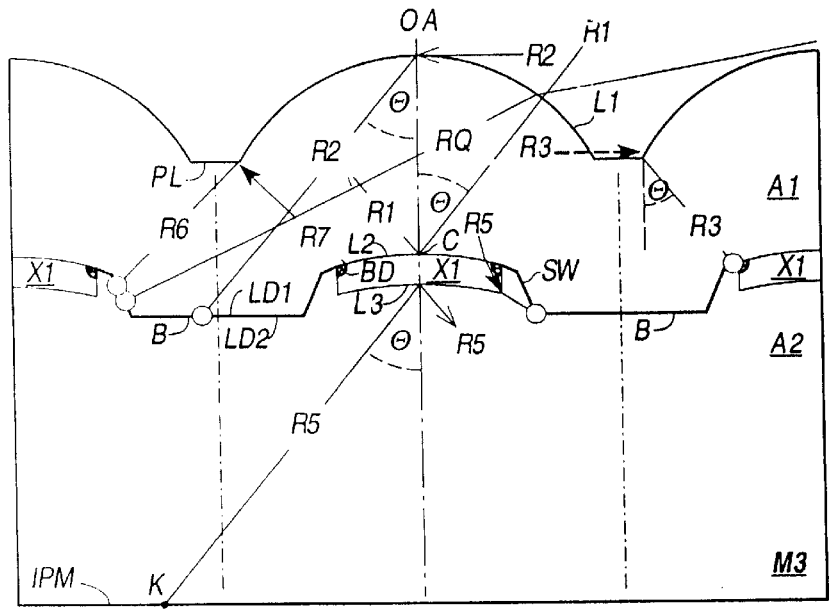
Figure 19D:
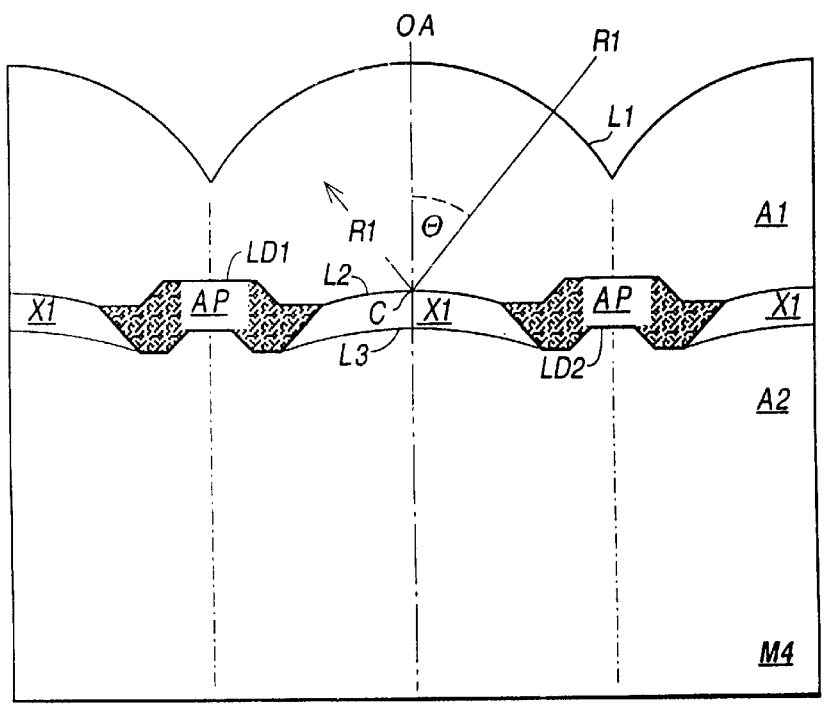
Figure 20A:
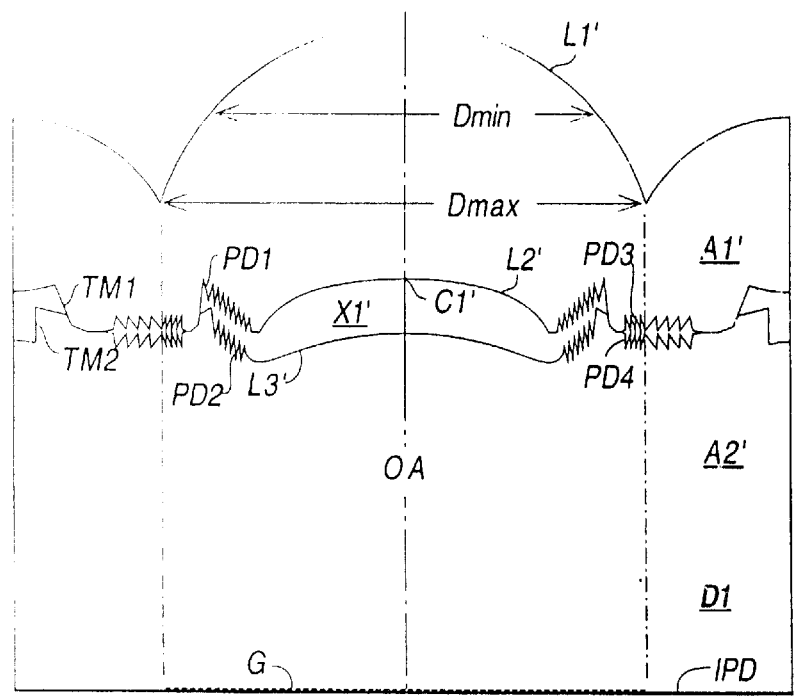
FIGS. 20A–20B are cross sectional side views of a three-element lens system according to the present invention.
Figure 20B:
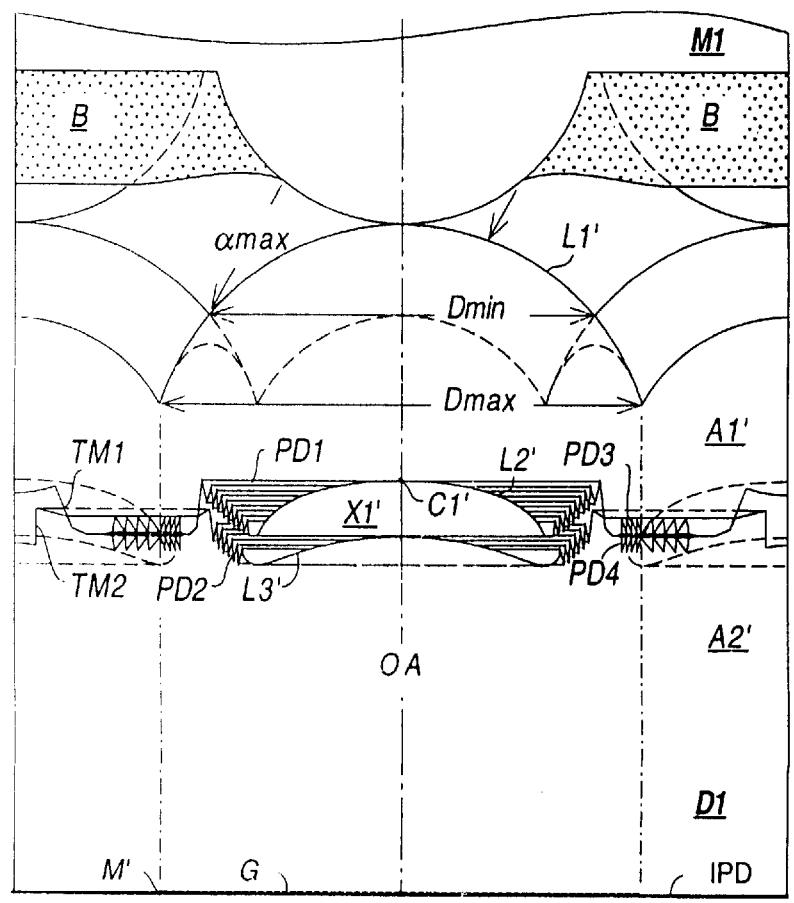

FIGS. 19B, 19C, and 19D demonstrate methods by which the system's apertures may be reduced. Due to the relatively small size of the lenses in many imagined applications, the aperture-reductions methods shown may be devised to yield diffraction-limited performance. FIG. 19B shows a second-case master M2 array with an internal geometry similar to that shown in FIG. 19A, but with the aperture restricted at L1 by dye sublimation aperture stop SD at L1. The array of FIG. 19B would typically be used to convey a master image to a duplicate. Dye sublimation stop SD is created by printing a perforated lattice on a flat polycarbonate substrate and the thermoforming the L1 lens relief in the material. At the glass transition temperature is obtained, the dye sublimates locally into the polymer. The interstitial area PL can be flat as shown. Alternately, conic alignment features CA can be included in the forming mold to encourage registration with display array D1.

FIG. 19C shows third-case master array M3. M3 may be used for photographic replication, or, reciprocally, for high-resolution viewing of transmissive images. Stray ray R6 is deflected by the transparent inner sidewall but is trapped by light-blocking material B at outer sidewall SW. Ray R7 is reflected by TIR at PL and then absorbed at SW. Land PL will therefore yield a dark appearance when the viewed image is observed at extreme field angles. The accessible field extended to point K, at which TIR at L2 totally occludes the image. The viewer sees a maximum 75° field that fades, due to defocus and diffuse reflection, as it approaches K.

FIG. 19D shows tripartite array M4 having internal aperture screen AP. The three layers shown are devised to self-align and prevent decentration of the refractive surfaces. The molds for all three parts are can be devised by photoresist-based or mechanical processes. The imbricated packing of the L1 lenses, indicated by the absence of an interstitial land at L1, provides a brighter image, but an implicitly reduced angular field. In imbricated arrays formed of materials having refractive indices near 1.6, the practical attainable viewing field is about 60°.

Figure 24:
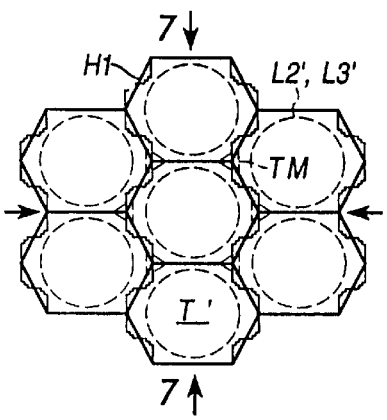
FIG. 24 is a top view of multiple lens cells of a lens array according to the present invention lens system

FIG. 20B indicates how an L1 aperture stop in master array M1, here shown with light-blocking material B applied, allows light to be conveyed to D1 without accessing neighboring cells. Ray Dmax designates the maximum angle at which light is allowed to pass from M1. This limit is set by the joint effect of the optics and the graphic output at master image plane IPM. An arrangement by which an efficient edge-to-edge tiling in the duplicate can be effected is shown in FIG. 24. The optical conversion from the master to the display array is essentially obtained by obscuring ambiguous regions of the master image plane and inducing a magnification factor of approximately 1.25 in the microimages, so that the images can tile seamlessly on the image plane of the duplicate array. While this conversion may be used to eliminate the dim peripheries of directly-recorded integral images, more commonly it would be implemented using master images derived from electronically processed image data. The master image provided may therefore be, for example, developed transparent film, a laser scan, or a luminous display.

It is usually preferable that the lenses in the master and duplicate have a common pitch. However, it can be useful in the replication process to locally shift the black graphic lattice in the master to assign it an effectively smaller pitch than that of the array. While this may be obtained by scaling the entire master optical system, more commonly it would be introduced as an inward radial pixel shift relative the image center point. This would affect the composition of the microimages only in that new pixels would be elected at some locations, while an equal number of image pixels were blacked out at others. The preponderance of pixels would be unaltered, but the black lattice would me minutely reduced in pitch. The net effect would be that the replication process would transpose this inward radial shift in the master to an outward radial shift in the duplicate. A viewer in of the duplicate image would then observe a slightly extended angular field, as the graphic material could be optimized to coincide with anticipated sight-lines. In an electronic display, the extended field would be introduced directly in the field layout.

Materials within the invention may also used to capture full-parallax images directly, according to the principles of integral imaging. Referring again to FIG. 19A, it may be understood that, at a certain refractive index, the circular microimage perimeter P1 will be contained within the mathematical projection of the hemispheric outer lens diameter on the focal plane. The index at which this may be obtained, in a purely refractive system, is in the vicinity of n=1.7. However, the graphic surface may nevertheless be efficiently employed if a somewhat lower-index, inexpensive material such as polycarbonate is used, and microimages allowed to overlap in a conscientiously arranged null zone Z. The null zone in the present case resembles an irregular hexagonal lattice. Image tile T1 is electively limited at points N, so that all points within the image tile are unambiguous.

In integral capture and reproduction, stray light must be prevented from passing to adjacent lens cells through the optically open regions in the outer array. As previously noted, each minute optical system, consisting of a region of the planar rear surface and a coaxial L1, an L2, an L3 surface, is optically isolated from each other lens cell. A TIR effect is produced at the L3 surface with respect to any light emitted from master microimage plane IPM. Light reaching the internal surface of L3 from any point K beyond a certain radius from the point where the optic axis intersects the microimage plane is fully reflected back toward the image plane. A pseudoscopic image, recorded on master image plane IPM and photographically developed, can therefore be optically translated to display image plane IPD, developed, and displayed as an orthoscopic integral photograph. Generalized photic elements PH, indicated in FIG. 23, can be construed to denote emulsion, discrete pixels, photodiodes, phototransistors, LEDs, liquid crystals, plasma cells, film recorder dots, ink dye, or toner dots, CRT triads, etc. For clarity, the figures show a regular orthogonal rasterization using discrete, square graphic units. It should nevertheless be understood that the system applies equally to continuous-tone images. Null photic elements PN can be disabled or eliminated. High-resolution image capture systems often use linear electronic arrays. A single column is shown which can be scanned across the width of a single microlens field to detect or emit image data. In a capture system, color data may be obtained by using an RGB-filtered trilinear sensor. Linear sensors PL may alternately be oriented on the opposite axis to that shown at PH. Linear sensors PL are staggered in an offset alternate manner, which can allow for surface wiring. A vertical scan can enable the capture of time sequences in full-parallax 3D images, without producing binocular conflict. If the image fields are scanned along axis Δt, temporal distortions can be masked by the display array's optical filtering. Some implications of this embodiment are described later in this specification.

Figure 21:
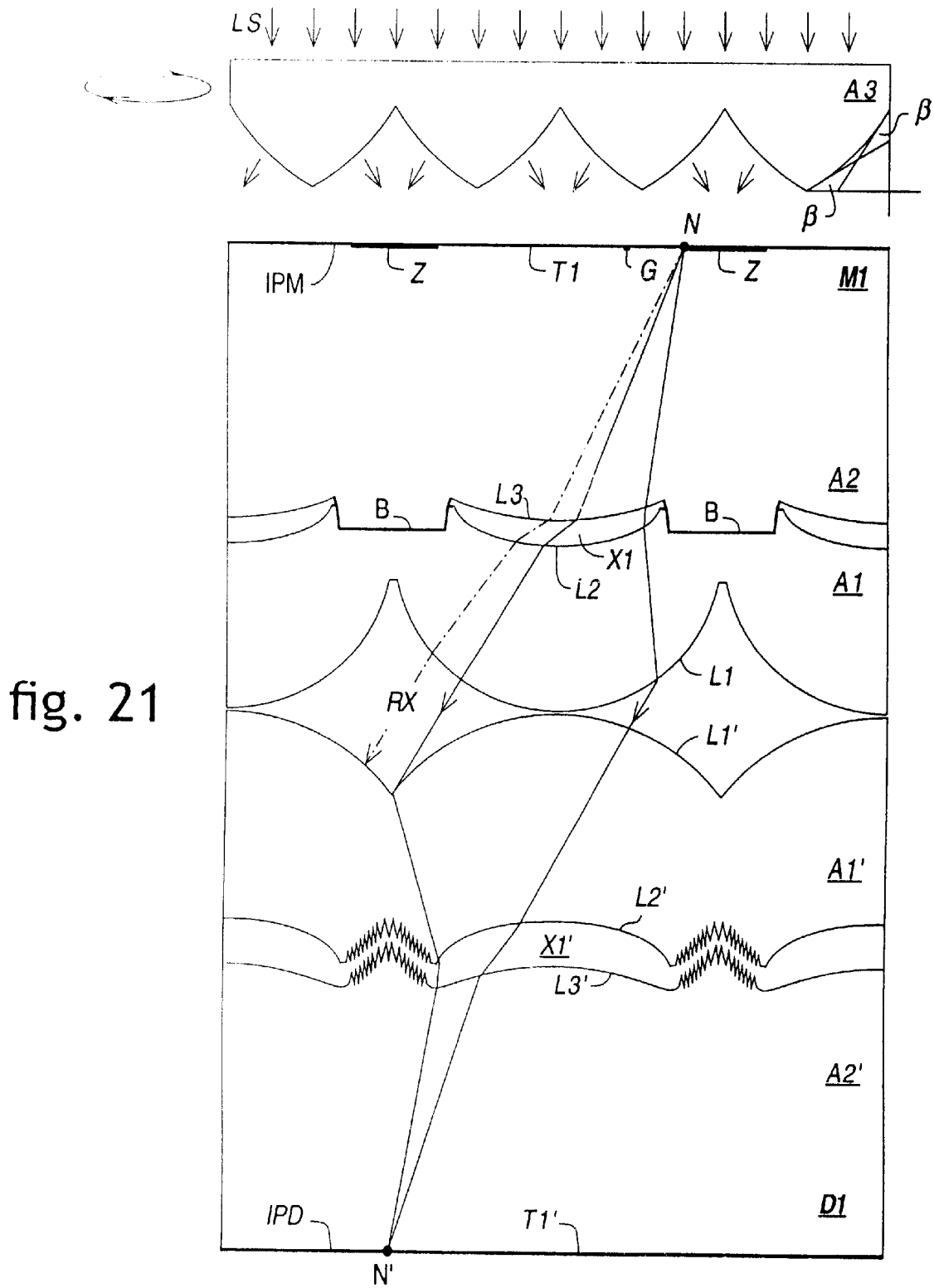
FIG. 21 is a cross sectional side view of a reproduction system according to the present invention.

In order for a lens-to-lens reproduction process to be effective, certain correspondences between the arrays must be maintained. FIG. 21 shows a schematic sectional representation of the required optical conditions. FIGS. 22 through 25 show schematic plan views of the respective graphic layouts of the arrays. A master array with no light-blocking material on its first surface, such as array M1, may be used if a master photographic transparency at IPM is lit with a controlled source of illumination, so that graphic elements G may be conveyed to a conjugate image plane. In FIG. 21, a source's angular output is predetermined by using collimated beam LS that is subsequently modified by convex axiconic lens array A3 that is oscillated in the plane of the array during exposure. Angle θ is given here as 32°. Assuming an A3 having an index of n=1.59, light is allowed to pass through the A2 portion of the M1 array only at angles between 12.7° and 25.40°, The restricted field provides equalized transmission across the field, and excludes stray rays such as ray RX. No light is conveyed from null zones Z, except in the case of a negative master photographic transparency. Alternately, a master of the M2 type may be used with conventional sources.

Figure 22:
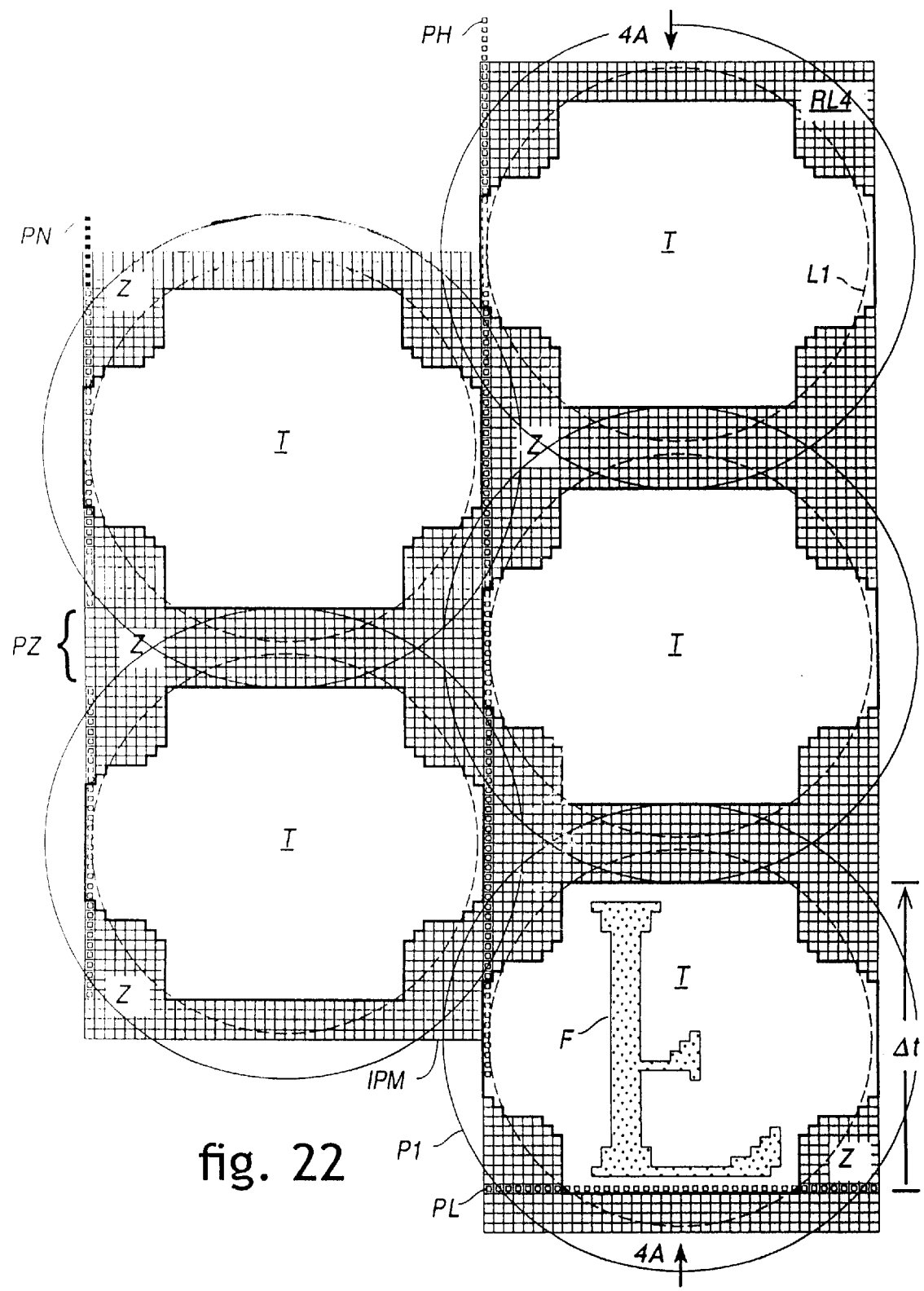
FIG. 22 is a plan view of the image plane of a reproduction system according to the present invention.
Figure 23:
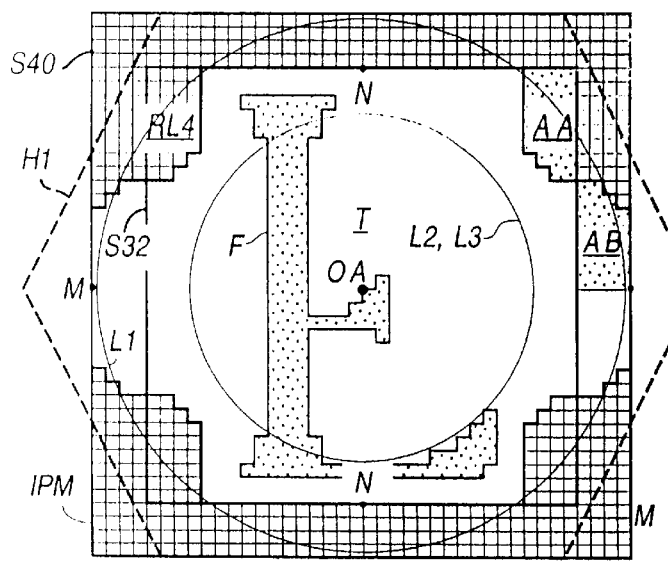
FIG. 23 is a schematic view of one cell of the image plane of the master array of a reproduction system according to the present invention.

In FIG. 22, gridded areas indicate null zones Z. The graphic layout of a single master lens cell is shown in FIG. 23. Null zones generally are not enabled to capture or reproduce light. In a positive-to-positive reproduction process, these areas would be darkened to suppress emission. If desired, an integrated photographic mask may be produced by the pre-or post-exposure of undeveloped film to a remote target image laid out in the shape of a single null zone pattern. It may be seen in FIG. 22 that the lozenge-shaped, overlapping intersections of lens field perimeters P1 all fall within the gridded null zones. Figure F in one microimage cell is shown as it would be oriented in a pseudoscopic master.

Figure 25:
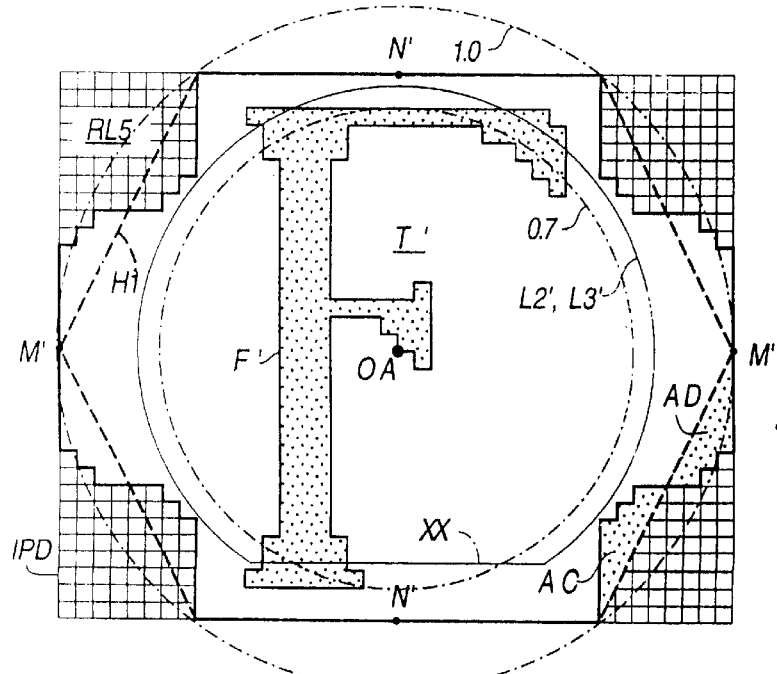
FIG. 25 is a schematic view of one cell of the image plane of a duplicate array within a reproduction system according to the present invention.

Hexagon H1, associated with the imbrication of display array D1, is shown in FIGS. 23 and 25. H1 has been derived from a square so that each side of the hexagon is either oriented with an orthogonal axis of the array, or has a slope that is a ratio of integers (1:2), rather than the irrational slope (1:1.73205 . . . ) associated with an equilateral hexagon. H1 has an area equal to the square of its smallest transverse dimension, and is equal in area to 40-pixel square S40. The abstract squares tile in an aligned manner on one of the orthogonal axes, and in an offset manner in the other. A master image may be calibrated with a regular raster grid such as RL4 in FIGS. 22 and 23. 32×32 pixel square S32 has been defined within the larger S40 grid. Points M and N represent the dimensional maxima of irregular microimage tile T.

The abstract square may be readily remapped into various profiles which tile in a regular manner. The microimage tile pattern can be square, hexagonal, stepped, or cruciform, or curved, yet exactly accord with the staggered square pitch shown. A stepped, slightly cruciform pattern, derived from interactive viewing behaviors, is used in the illustrated applications. In FIG. 23, it may be seen that square S32 has been modified by the displacement of area AA to AB.

The arrays are configured so that the microimages undergo an optical magnification of 1.25 during reproduction. The same pitch is maintained between microlens centers. A 4μ dot in the master would appear as a 5μ dot in the duplicate. Lens radii and focal lengths in the two arrays would also roughly accord with this proportion.

In the layout of the image cells of the display array, shown in FIG. 25, shaded areas AC and AD are mapped relative to hexagon H1 so that displaced areas tile in the same proportion as tile T. It will be seen by seen by reference to FIGS. 21 through 25 that the microimage tile T, when projected into the lens cell of a duplicate array image plane IPD, will tile on duplicate image plane IPD with no null areas. A region of the display array is shown FIG. 24. Image elements may be envisioned as having been mapped onto a raster lattice RL5 of 1.25 times the pitch of the master grid RL4.

FIG. 25 shows the figure F' representing the appearance of the letter "F" after reproduction by the method shown in FIG. 21. The figure has the proper orientation and chirality when viewed from the lenticulated side, indicating that the resulting image will be orthoscopic. The array may be oriented for maximum effect. Animations may be extended by aligning a tiles' longer dimension with the vertical axis; 3D images can accommodate eye separation by assigning the wider field to the horizontal axis.

Figure 26A:
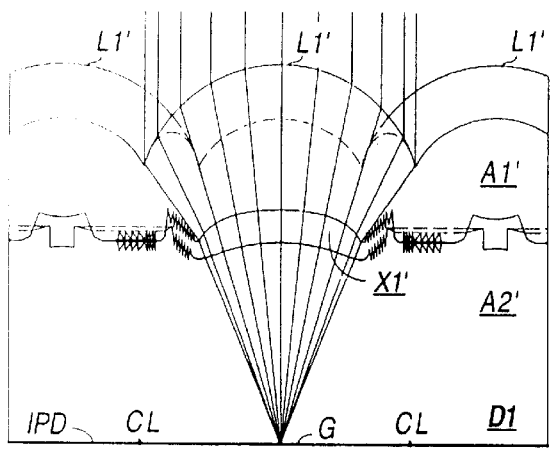
FIG. 26A is a sectional side view of a three element lens illustrating on axis performance of a lens system according to the present invention.
Figure 26B:
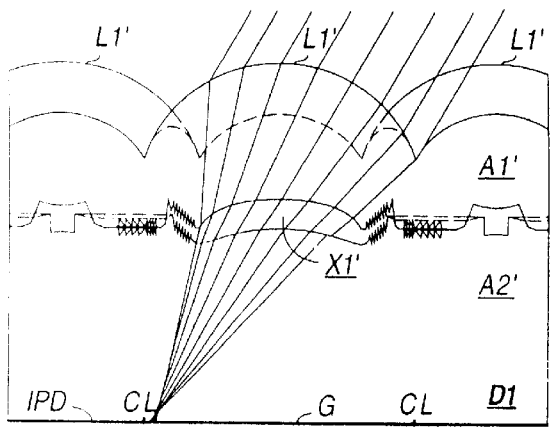
FIG. 26B is a sectional side view of a three element lens illustrating off axis performance of a lens system according to the present invention.
Figure 26C:
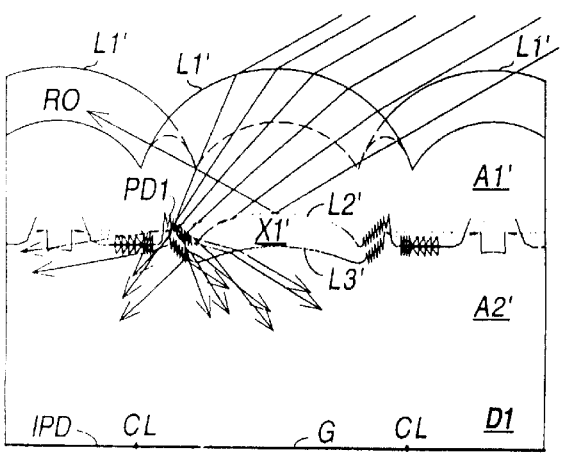
FIG. 26C is a sectional side view of a three element lens illustrating diffuse illumination of the image plane from prismatic diffusers.

FIGS. 26A, 26B, and 26C schematically describe the general process of simultaneously illuminting and viewing a D1 image having low-index fluoropolymer inclusions. FIG. 26A shows the optics aligned on a central point. FIG. 26B shows a lens cell aligned on a peripheral microimage location, associated with a viewing angle of 30° from the optic axis, near cell limit CL. In FIG. 26C, ambient light arriving at 60° is conveyed diffusely to the image plane via optional prismatic reliefs. At extreme angles, the convergent light is diffused, and a more equal internal illumination obtained. Ray RO may be seen to escape through L1'.

Figure 27A:
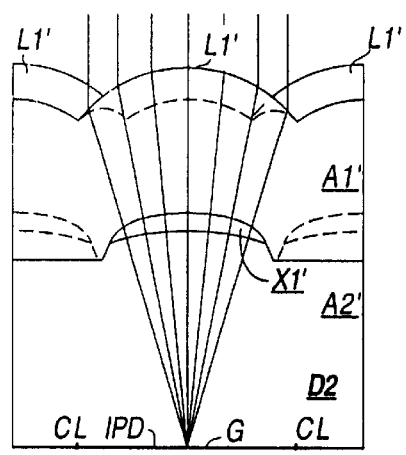
FIG. 27A is a sectional side view of a two element lens illustrating on axis performance of a lens system according to the present invention.
Figure 27B:
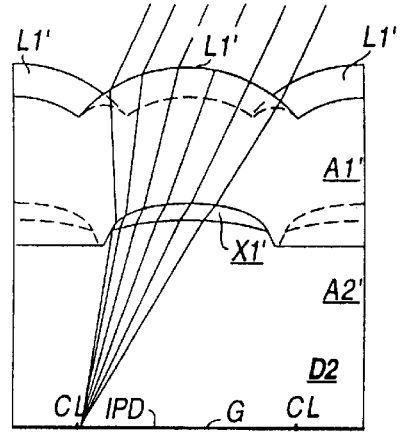
FIG. 27B is a sectional side view of a two element lens illustrating off axis performance of a lens system according to the present invention.
Figure 27C:
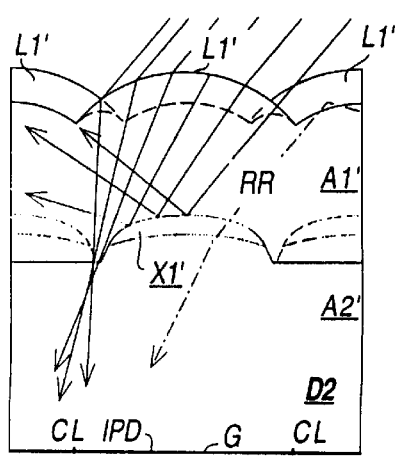
FIG. 27C is a sectional side view of a two-element lens illustrating diffuse illumination of the image plane from prismatic diffusers.

In display arrays having air inclusions, loss of reflected ambient light through L1 can be significant. FIGS. 27A, 27B, and 27C schematically describe the general process of simultaneously illuminating and viewing display having air inclusions D2, which has been devised according to the earlier general discussion. The ratio of the sag height to the greatest clear aperture is approximately 1:4.2, and provides a viewing field of 50°. FIG. 27A shows the on-axis performance, and 27B the array's performance near cell limits CL. FIG. 27C shows that at a field angle of 40°, no light is conveyed directly through the internal optics, but instead is either reflected by TIR or transmitted through internal interstices. Interstices generally transmit only the most aberrant marginal rays. Rays rereflected off L1 surfaces return to the image plane, as indicated by ray RR. In either case, the distribution of passive illumination at the image plane is highly diffuse. The design shown in 27A through 27C accords with the optical geometry of Case 5 in the above tabular data.

Lens elements, lens systems, and lens arrays for use with the present invention can be manufactured using any known method of manufacture of optical devices. Methods of manufacture that have been identified as appropriate for use with this invention include both processes using a master from which molded replicas are created, and the manufacturing of individual parts by methods such as etching and reflow processes.

The formation of a master may be achieved by diamond-turning processes or etching processes. One or more generations of molds may be created by electroforming. The lens systems of this invention may then be created from a mold using injection-molding, compression molding or other molding processes.

Etching, lithographic and reflow methods of manufacture that have been identified as appropriate for use with this invention include photoresist reflow methods, isotropic etching methods, and anisotropic reactive ion etching using a grayscale mask. Etching, lithographic and reflow methods are particularly useful if lens system within an array are other than identical. Locally varied lenses might be used, for example, to extend the field of an array by altering the optical of the lens systems in a progressive manner to target a given object position, such as to accommodate a given viewing position.

The lens arrays for use with the present invention can be created such that one or more lens elements comprising the lens array are monolithic such that multiple elements are a part of single array component or discrete lens elements can be arranged to create lens systems, and discrete lens systems can be arranged to create lens arrays.

Figure 28A:
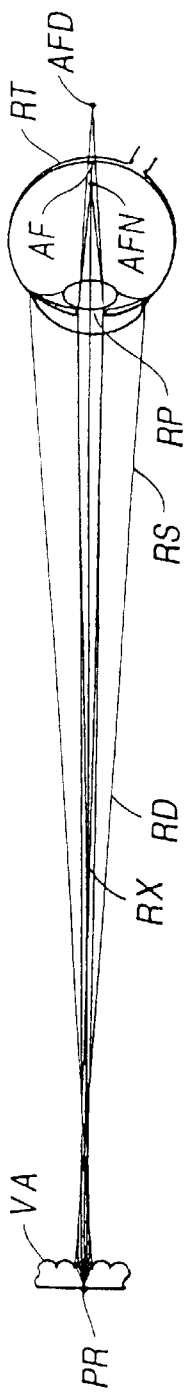
FIG. 28A is a schematic view of the emission of light from a conventional array of lenses.
Figure 28B:
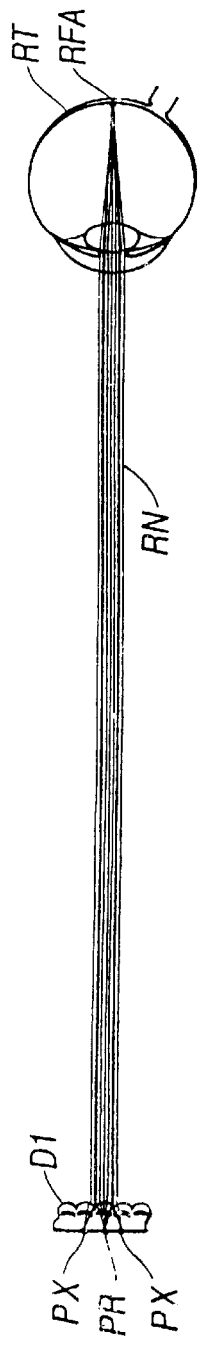
FIG. 28B is a schematic view of the emission of collimated light from a lens array according to the present invention
Figure 28C:
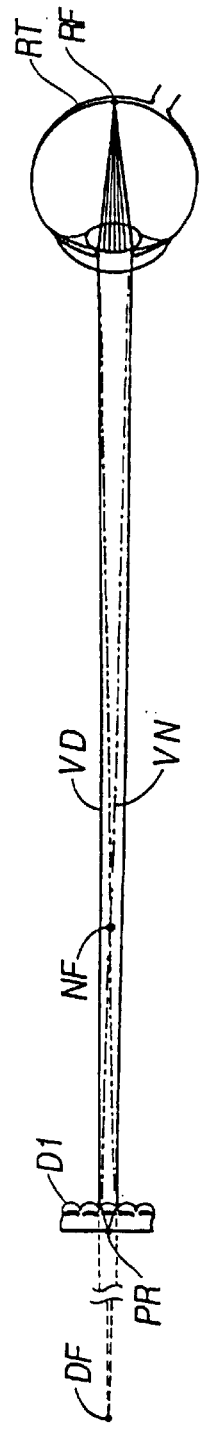
FIG. 28C is a schematic view of the emission of light at a predetermined vergence angle

FIG. 28A-FIG. 28C are schematic diagrams illustrating viewing conditions of lens arrays. In a real scene, the lens of the eye accommodates to adjust to the radial emission of object points located at a particular distance. Because of the aberrant optics of conventional cylindrical or spherical arrays, the accommodative subject distance is often somewhat indeterminate. This circumstance is illustrated schematically in FIG. 28A, in which VA is an uncorrected array, PR is a radial point emission fro the graphic surface. The resulting ray set produced by the lens includes diverging rays analogous to those produced by real subjects, but also includes cognitively inconsistent rays such as crossing ray RX and stray ray RS. The set of rays RP captured by the pupil cannot be fully converged at a point, and instead produces an ambiguous focus at AF on retina RT, intermediate between the near focus AFN and the distant focus AFD. Stray rays not captured by the pupillary diameter fall into other viewing angles, reducing image contrast. Correction of aberrations according to the present invention allows microlenses to be configured to generate the diverse focal conditions described in FIG. 2A through FIG. 2B above.

The presumption of infinite conjugates yields the focal condition shown in FIG. 28B. In this case, the pupil is underfilled by the output of the microlens. The eye is focused at infinity, but is also required to accept rays RN produced from points PX in neighboring microimages, generating a graphically ambiguous retinal focal spot at RFA. A preferable condition is shown in FIG. 28C. If the lens width and the viewing distance are predetermined, an afocal vergence angle may be calculated that produces an unambiguous focus at RF. In embodiments of the invention, display optics are devised accordingly to produce a divergent ray set that fills the pupillary area at an anticipated viewing distance. The focal condition emulates a state to which the eye is well adapted, and all rays in the image may be brought in focus at the retina at RF without the ambiguities inherent in both the indeterminate focus in FIG. 28A and the underfilled state shown in FIG. 28B. Vergence angles, being the full angular difference between outermost divergent rays VD, are typically under one degree.

In the general case, the vergence angle may be calculated by taking half the pupil radius, subtracting half the lens pitch, dividing it by the viewing distance, taking the inverse-sine of this quotient, and multiplying the result by two. For example, a 300 mm viewing distance, a 4 mm pupil, and a 250° spherical lens will yield a vergence angle of 0.7160°. Since the virtual focus is located at (0.125/tan 0.358°)+300 mm, the display emulates an observer-to-object distance of about 320 mm. This distance is shown schematically in FIG. 28C as distant focus DF. An angle of 0.763° would be associated with a field focus at the actual image plane. The difference between 0.716° and 0.763° indicates the degree of astigmatism that would be present in a cylindrical array of similar pitch.

In 3D systems using refractive arrays, scene parallax and vergence angles can depart from their natural correspondence. For example, haptic systems using autostereoscopic electronic displays often involve the manipulation of a simulated object in the free space in front of a display. The parallactic attributes of this condition are readily simulated. However, the conventional optical design of a microlens array induces the eye to accommodate to points just behind the display screen. This situation preventing a user from concurrently focusing on hands or tools in the free space occupied by the apparent object.

It may be seen by reference to FIG. 28C that a focal condition exists that accurately fills the pupil while producing a virtual image field ahead of the image plane. The array design can be modified, by shifting the image plane forward or expressly reparameterizing the design, to converge on an imaginary finite conjugate in the free space ahead of the screen, and allowing the rays to cross at near-focus point NF. In a display having half-millimeter microlenses designed for viewing at 500 mm, distant focus DF would be located 72 mm behind the array, while near focus NF would be 62 mm in front of the array. Because the region sampled from the graphic plane is the same as it would be if the virtual focus were at DF, the parallax and orientation of the 3D image are largely unaltered. This effect may similarly be implemented in print images to produce so-called floating images that are reconciled with natural vision.

Non-imaging application are within the scope of this invention. Non-imaging applications included, but are not limited to, telecommunication systems. FIG. 2A illustrates a focal situation having finite conjugates. A specific example of one embodiment of the invention, which has finite conjugates, is illustrated in FIG. 11 and illustrated by the tabular data of Case 4. The illustrated embodiment may be used for communication between remote optoelectronic devices.

It was previously noted in the main embodiment that a time-delayed line scan does not implicitly produce conflicts in a three-dimensional image. In microlens-based angular displays, animation and full-parallax do not conflict, provided the binocular axis matches the horizon of the array, and a predetermined viewing distance is maintained. In modifications of the invention, this understanding helps to free the capture process from conventional time constraints.

The acquisition might take ⅕ second to 1 second. A capture period of such long duration would often yield time distorted source images.

However, these images are never be seen by an observer. Instead, because of the optical filtering by the array, the temporal distortion at this rate is normally imperceptible, even when the viewing provisions depart from the ideal condition recited above. Furthermore, the scan be expressly delayed to induce a greater illusion of animation in the final image, as the maximum temporal step rate between rows is not determinate. In a digital system, each synchronous set of twenty linear scans, one per camera module, may be acquired independently and retained in memory. The camera may then be returned to a mounting to progressively collect image data over an extended period of time, ultimately producing time-lapsed, three-dimensional images representing long time intervals. In the final display, the time-lapse is reconstructed with a relative shift in the vertical viewing angle, as when a hand-held image is tilted.

In order to optimize the temporal correlation of the image, individual image capture fields in the camera array would need to be either radially desynchronized or decentered. Preferably, image fields would be decentered radially outward from the center of the array so that the image field centers, expressed through lens normals, would converge at a common point in the object field corresponding to the anticipated viewing distance. A particular adaptation of the time-lapse capability involves an interpolation based on a modified light-field function to provide highly predictive intermediate image data. The complete plenoptic light-field function maps the wavelength, intensity, direction, and temporal variation of all light passing through a volume. Because this data set is infinite even in finite volumes, computational implementations of the plenoptic function consider finite data sets sampled, by various models, from the comprehensive function.

An autostereoscopic still image need only consider certain angles within a small area of a single plane within a given volume. Furthermore, since source images need not represent real scenes, the time domain may be convolved with the spatial domain, and one variable eliminated. Time-distorted image sets may then be subjected to computational transforms that have previously been applied to sets of conventional plane images. Intermediate image data may be efficiently interpolated by considering the captured grid of images as sampled locations in a multidimensional data volume. Additionally, known image-based rendering systems have used approximate depth maps, extracted from parallax shifts in source images, to improve sharpness and to reduce mosaic artifacts in interpolated images. In the invention, motion and depth can be convolved as a integrated displacement map. The map then can be used to perform analogous function in sets of time-shifted source images.

In image-based three-dimensional imaging, the area captured generally coincides with the area displayed. If a wider field of is allowed in the capture device than in the display, and a light-field function is used to model the data volume, additional views may be extrapolated peripherally. Provided the extrapolation is relatively constrained, only small spatial data voids are encountered. Where encountered, these voids may be filled, for example, by repeating pixels, by reference to a displacement map, or by intelligent analysis of the image content. By this method, the recording device may implicitly be made more compact and portable.

A set of alternate tilings devised for a square-lens array, canted to 45°, are shown in FIGS. 29A through 32C. In some applications, such as desktop printing devices, it is desirable to be able to freely orient graphic images. The canted square accommodates arbitrary changes in format. Images with differing axial biases may optionally be laid out on the same document. Rectangle T2, shown in FIG. 29A, is formed in a 2:1 proportion in order to tile in either a portrait or landscape orientation.

Hexagon T3, shown in FIG. 29B, in which a is 144° and δ is 108°, will also tile in such a manner. FIG. 29C shows coarsely stepped tile T4 in the horizontal landscape orientation, while FIG. 29D shows coarsely stepped tile T4' in the vertical portrait position. FIGS. 30A and 30B show the respective locations of the tiles and the lenses in vertical and horizontal positions. FIG. 31 shows tile T7 with a orthogonal, biaxial bias that eliminates some oblique views. Tiles may also vary according to their pixel resolution, as indicated by coarsely stepped T4 tiles in FIG. 32A, moderately stepped tiles T5 in FIG. 32B, and by finely stepped tiles T6 in FIG. 32C.

Figure 33:
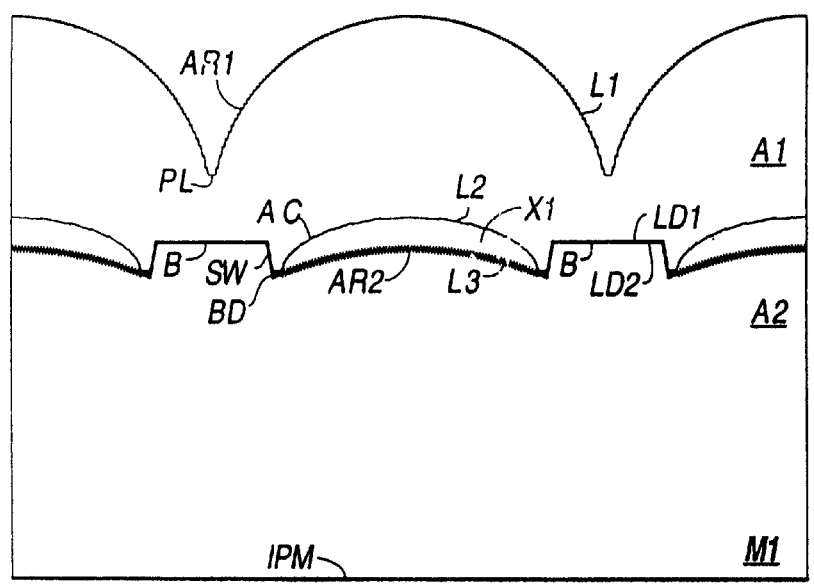
FIG. 33 is an array M1 having conic subwavelength structures AR1 and AR2.

Array M1 in FIG. 33 is shown having conic subwavelength structures AR1 and AR2. Because the scale of the conic structures is significantly less than the period of the wavefronts, the structures are not resolved by the wavefronts. The gradient undermines the boundary effect that produces surface reflection. Optional hybrid refractive/diffractive surface AC is shown disposed at L2. The surface may be used according to known principles to achromatize or athermalize the optical system. Typically, 5% of the light would be reflected an untreated air/polycarbonate interface. In certain lighting conditions, this surface reflection introduce a degree of haze to the viewed image. Image saturation and contrast can be enhanced by the use of a single conformal coating of a low-index material such as magnesium fluoride or a soluble fluoropolymer such as CYTOP (Asahi Glass). Subwavelength anti-reflective microstructures, such as optical slurries or periodic "moth-eye" relief microstructures, can provide an analogous effect. AR relief structures are of particular interest in the invention, as they can be produced monolithically during molding of the arrays, and can therefore be included at little additional cost.

Hybrid refractive/diffractive surfaces may be employed at any of the three boundaries to reduce chromatic aberrations.

Hybrid surfaces are readily fabricated using the anisotropic etching processes currently used to derive microoptical reliefs. However, the additional theoretical correction provided by the inverse dispersion of the diffractive component must be weighed against other introduced aberrations, imperfect diffraction efficiencies, increased scattering, and additional dwell time in the molding process. Hybrid surfaces can more readily be justified where the significant band was constrained to less than the 400 nm to 700 nm visible spectrum. Examples of such systems would include image capture systems using color-separating dichroic or mosaic filters, RGB triad displays, and IR, UV, or quasimonochromatic diode-laser based systems. In these systems, diffraction efficiencies of approaching 100% can often be obtained by the use of continuously-blazed diffractive reliefs.

Figure 34:
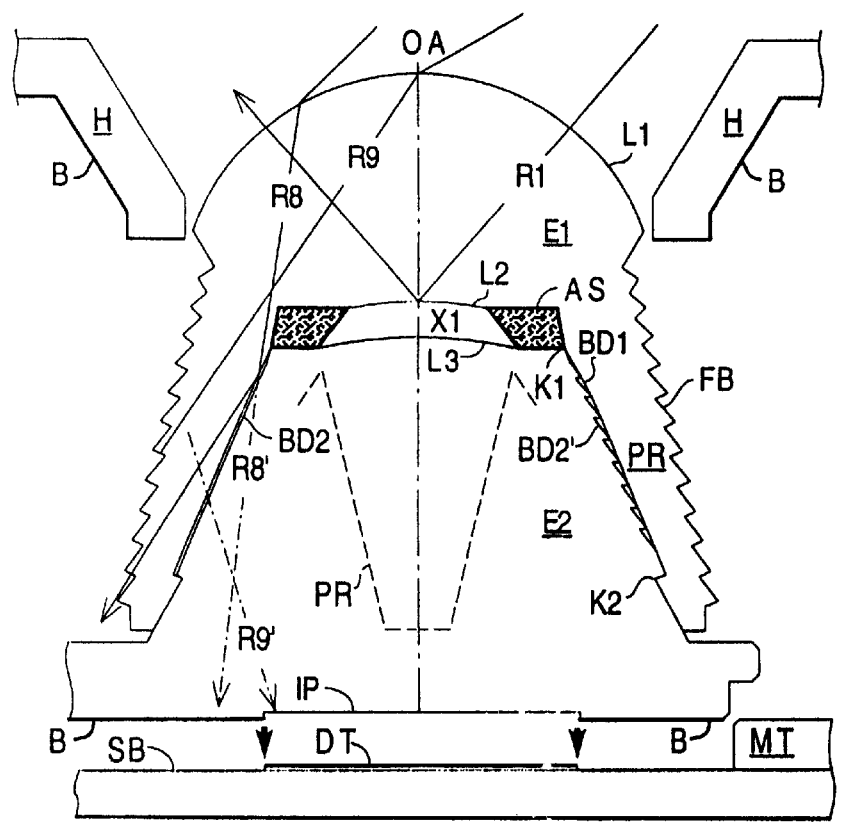
FIG. 34 is an inexpensive discrete imaging device.

An inexpensive discrete imaging device, devised according to the principles of the invention, is shown in FIG. 34. The device includes an electronic detector DT located on a substrate SB and reinforced by a mount MT. The transparent optical elements E1 and E2 are designed to mechanically engage without the application of adhesive. Centration is provided by contact at D1 and D2, while intimate contact between the sidewalls at other locations is physically discouraged. Because of the disposition of the air gap, internal reflection shunts stray light away from the detector. Light-blocking annular aperture stop AS of predetermined thickness in inserted within the system. the washer-like annular stop may be resilient to exert upward force on E1 so that prongs PR lock firmly at D2.

Element E2 would commonly be bonded directly to the electronic component using an index-matched nonconductive optical cement. IP represents the image plane of the array. The IP surface may be located in front of the detector and equipped with microoptical elements such as diffractive or refractive lenses, color-separation gratings, etc. In these cases, a space may be left between the detector and surface IP in order to allow a distance over which the desired optical effect might be obtained. The space may be filled with air or a bonding material having a differing refractive index from that of the E2 element.

The components may be formed of a material having sufficient elasticity so that prongs PR of element E1 can be made to momentarily expand to an increased diameter. Upon the application of a predetermined degree of force in alignment with the optic axis, prongs PR, upon contact with the conical exterior of E2, expand and then contract to form a mechanical connection with E2 at K1 and K2. The structure can be varied to make the connection either permanent or reversible; while four prongs are indicated in the drawing, the conical shell of E1 could be divided into any number of individual sections.

Housing H may be devised of any opaque rigid material. The housing would typically be formed so as to recess the L1 surface relative to the outer surface of the housing. The array design shown tolerates a degree of inconsistency in the alignment of the optical elements and the housing aperture. The optics in this case were devised in accordance with Case 3 of the recited optical geometries. The lens design is more center-weighted than the prior examples. At f2, the lens produces a well corrected central image, with lateral color being particularly well corrected. The opening in Housing H may act as a secondary aperture stop. Light from a scene is captured by the L1 surface and directed through the core optics of the array, within the predetermined angular range, to detector DT. Rays R1 are reflected away by TIR as in prior embodiments. Unevenly broken lines at R8' and R9' indicate ray extensions that could reach the image plane. Rays R8 and R9 are instead transmitted out of the system by inner boundary BD1 and outer fresnel boundary FB. Light passing through L3 at extreme angles would be directed by internal reflection at optical boundary BD2 at the conic side-walls to regions of the substrate beyond the detector. Alternately, light may be directed out of element E2 by internal fresnel boundary BD2'.

A person of ordinary skill in the art will understand that applications of aspects of this invention are not limited to the recited embodiments. Further embodiment include, but are not limited to, the embodiments described below. Color filtering may be introduced by dyes dissipated throughout the array material, or locally by printing, dye sublimation transfer, or droplet deposition. For example, differing dyes may be introduced into separate reservoirs of the fluid UV-curing fluoropolymer. Metered amounts can then be delivered in a RGB or CMY pattern to the concave second surface before the arrays are bonded, creating an internal mosaic filter for color imaging applications.

A high-resolution monochromatic image may be obtained, and color subsequently interpolated from a single discrete polychromatic image. In general, the optical geometry may be used in monochromatic, quasimonochromatic, or polychromatic systems, and may include radiation from beyond the visible spectrum.

Image processing can include retrospective focal correction, color and contrast adjustments, compression and decompression, edge enhancement, pseudoscopy rectification, microimage displacement based on a presumed viewing distance, view interpolation, view integration and synthesis, or transposition of the apparent location or orientation of subjects.

Spectral bandwidth is also a design consideration when separate color channels are used in the reproduction process. Color photographic images may often be produced at higher resolutions by successive exposure light of differing wavelengths through grayscale spatial light modulators. The succession may be temporally or spatially sequential. In either case, as the optimal focal length is somewhat wavelength-dependent, some benefit can be obtained by matching the focal plane to the target band. In a spatial reproduction sequence, for example a system using three separate arrays equipped with LCD modulators and discrete red, green, and blue light sources, optimization may be obtained by providing relatively a greater overall thickness to arrays that transmit the relatively longer wavelengths. Alternately, a single array and modulator can be employed using time-sequential RGB illumination, and the focal situation modified in situ. This adaptation can be made by, for example, mechanically shifting the focal plane through the use of a piezoelectric actuator and an optical coupling fluid, or by a varifocal effect introduced in an index-variable liquid crystal planar reservoir under the influence of an electrical field. For ease of maintenance and extended durability, master arrays would commonly be formed of glass rather than plastic.

Arrays used as masters for face-to-face reproduction are generally optimized by restricted apertures to produce spots at, or just under, the Rayleigh limit. Except at fine lens pitches, this would permit the use of aperture plates to improve accurate alignment and image transfer. The aperture plate may be a discrete device installed between the arrays during reproduction, but would more often be permanently integrated into the master array. Methods of forming an aperture plate include perforation, etching, boring, molding, tampo printing, or dye transfer.

Regions not part of the optical corridor are generally assigned a secondary use, such as light absorption, diffusion, or structural support. In the systems shown, any portion of any internal aperture that is not accessed by rays in the active optical pathways may be electively and usefully abbreviated. For example, rays converged by the aperture provided by a hexagonal first-surface aperture, and intersecting the second refractive surface sweep out a delimitation on the second surface that defines a irregular rounded polygon having, having, due to its rotational asymmetry, a slight third-dimensional elevation. The intersection of the same rays set with the third surface identifies a similar but slightly larger clear aperture. In some manufacturing processes where nonrotational surfaces are allowed, such as reactive ion etching, these irregular geometries may electively be implemented to optimize the transmission characteristics of the interstices and the array's mechanical structure. A similar benefit may often be obtained using a best-fit elliptical outline.

A display may include two or more planes of graphic material at differing focal lengths, so that an array can produce a focal output in some areas or at some angles, and an afocal output at others. This focal shift can produce a varied focal condition that activates the accommodative focusing ability of the eye. The focal planes may be in discrete layers, or in a monolayer that has been selectively displaced.

In further anticipated embodiments, internal lands in lens arrays may be made slightly concave, rather than flat, so that the region is not starved of the cement or light-blocking material during pick-up from a roller applicator. In the case of the fluoropolymer-filled lenses, volumetric calculations may be performed and the surface geometry derived, allowing an applicator in contact with the raised lands or with the lens vertices to deposit metered volumes of fluid material, so that no extraneous material is expressed when the arrays are brought in contact.

It is well known that an optical correction may invariably be distributed over a larger number of surfaces. Arrays may therefore include divided layers of lenses that mimic the effect of the illustrated designs, without departing with the invention's envisioned scope. The two constituent arrays need not be monolithic to conform to the invention. For example, it is common practice to fabricate microlenses in thermosetting epoxies or acrylates upon planar substrates such as prefabricated plastic sheets or glass windows. The degree of freedom allowed by differing indices my be implemented without departing from the invention's intended scope.

Lithographic processes do not require all lenses in an array to be identical. Locally varied, idiosyncratically formed lenses might be used, for example, to extend the viewing field of a dimensional image by altering the optics of the lenses in a progressive manner about a given locus in order to target a presumed viewing position. In a spherical lens system, the center point of the image would typically include the only lens system that was showed true rotational symmetry.

Microlenses may include one or more conformal antireflective, antiabrasion, or heat-resistant coatings. An array may be made so as to be displaceable in a plane parallel the graphic material, so that the image may be manually or automatically scrolled to provide an animated appearance. The graphic variability may be used for naturalistic, textural, decorative or ornamental devices or surfaces as well as imagery. Views may be distinguished as separate pages of text.

In addition to their embodiments as planar graphic materials, the imaging arrays may be mounted upon or within a functional or ornamental device such as a watch, watchband, bracelet, brooch, pendant, purse, belt, compact, writing instrument, drafting tool, lunchbox, restaurant menu, placemat, mousepad, license plate, lampshade, nightlight, optical data disc, drinking cup, credit card, identification card, gamepiece, toy, sticker, clothing accessory, or souvenir. Lens arrays may be formed as concave, convex, or complex surfaces; angular image data and microimage tiles may be adapted according to the precepts herein described.

Digital source images may include translated computational holograms. The image plane may be a hologram or include holographic regions. Visible data may be derived from invisible processes, as in radar, sonography, X-rays, electron microscopy, nucleomagnetic resonance (NMR), PET or CT scanning, or magnetometry. Disciplines such as statistics, industrial diagnostics, engineering optimizations, product design, cartography, seismography, meteorology, remote sensing, astronomy, medical imaging, and molecular modeling may generate data which is most readily appraised as a three-dimensional or animated representation. By enabling only on-axis viewing, arrays using the recited equiangular TIR geometry may be employed as privacy screens.

The scope of the invention should not therefore be construed to be limited to the description of the specific applications specified in this document, but should instead be understood to be defined by the broadest understanding permitted by the substance of the information recited herein, and by the fullest legal scope of the appended claims, in which:

What is claimed is:

1. A lens comprising in series:

a first convex surface;

a first concave surface optically coupled to the first convex surface via a first material; and a second convex surface optically coupled to the first concave surface via a second material having a lower index of refraction than the first material, all of said surfaces cooperating such that light incident on the first convex surface outside a predetermined angle is prevented from passing through the first concave surface.

2. The lens of claim 1 wherein the first concave surface is an equiangular surface relative to light introduced via the first convex surface.

3. The lens system of claim 1 wherein the first convex surface has a radius of curvature R and the second convex surface is positioned at least a distance equal to 0.05R from the first concave surface.

4. The lens system of claim 1, further comprising a fourth surface, wherein the first convex surface and the first concave surface form a first lens element, and the second convex surface and the fourth surface form a second lens element.

5. The lens of claim 1 wherein the second convex surface has a shape selected from oblate, prolate, spheric, and higher-order aspheric.

6. The lens of claim 1 wherein the surfaces are rotationally symmetric.

7. The lens of claim 1 further comprising means for correcting aberration.

8. The lens of claim 1 wherein the second material is air.

9. The lens of claim 1 wherein the second material is a fluoropolymer.

10. A lens comprising:

a. a first refractive surface; and b. a second refractive surface optically coupled to the first surface, the surfaces cooperating such that c. a collimated set of light rays incident on the first substrate is converged into a cone of rays arriving on the second surface; and d. light outside the predetermined incident angle prevented from passing through the second surface.

11. The lens of claim 10 wherein (i) the first and second surface are coupled via a material having a refractive index and a critical angle associated therewith, and (ii) for a predetermined incident angle of light impinging on the first surface, the convergent cone arrives on the second surface such that the critical angle is encountered substantially simultaneously by all rays in one cone.

12. The lens of claim 10 wherein the first surface has a positive curvature.

13. The lens of claim 10 wherein the first surface has a radius of curvature and the lens has a thickness at least equal to 75% of the radius of curvature.

14. The lens of claim 10 wherein the light prevented from passing through the second surface is reflected away by total internal reflection.

15. The lens of claim 10 wherein the second surface is radially symmetrical.

16. The lens of claim 15 wherein (i) the first and second surfaces each have a center of curvature, (ii) the second surface is oblate and has a negative curvature, (iii) the first surface has a positive curvature, and (iv) the centers of curvature of the first and second surfaces are substantially aligned.

17. The lens of claim 10 wherein the first surface has a curvature correcting spherical aberration.

18. The lens of claim 10 further comprising a third surface optically coupled to the second surface, the third surface having positive curvature reducing an image-field perimeter of the lens.

19. The lens of claim 18 wherein the third surface is displaced from the second surface by a distance sufficient to produce a flat focal field.

20. The lens of claim 19 wherein the lens had a lenticular structure.

21. The lens of claim 18 wherein the lens has an image field, the third surface having a substantially prolate geometry to effectively correct spherical aberation across the image field.

22. The lens of claim 18 wherein the second and third surfaces are separated by an optical material having a refractive index such that light received by and reproduced by the lens is substantially confined to a single central angular range.

23. The lens of claim 18 wherein interstitial space exists between the surfaces, the interstitial space being transparent and diffusive to promote internal distribution of light.

24. The lens of claim 18 wherein the first and second surfaces are separated by a first material having a first refractive index, and the second and third surfaces are separated by a material having a second refractive index, the second refractive index being greater than 1 but less than the first refractive index.

25. The lens of claim 24 wherein the first surface has a center of curvature and the second surface has a vertex substantially aligned with the first-surface center of curvature.

26. The lens of claim 18 further comprising a positive-power diffractive element on at least one of the second and third surfaces.

27. The lens of claim 10 wherein (i) the first surface has a radius of curvature R and (ii) the first and second surfaces are coupled by a material having a first refractive index, and (iii) the second surface is positioned a distance R from the first surface, the lens system further comprising a third surface optically coupled to the second surface by a second material having a lower index of refraction than the first material, the third surface being positioned at least a distance equal to 0.05R from the second surface.

* * * * *